United States Patent
Iida et al.

(10) Patent No.: US 10,818,650 B2
(45) Date of Patent: Oct. 27, 2020

(54) SEMICONDUCTOR MODULE AND METHOD OF MANUFACTURING THE SAME, AND METHOD OF COMMUNICATION USING THE SAME

(71) Applicant: RENESAS ELECTRONICS CORPORATION, Tokyo (JP)

(72) Inventors: Tetsuya Iida, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/598,858

(22) Filed: Oct. 10, 2019

(65) Prior Publication Data

US 2020/0161284 A1 May 21, 2020

(30) Foreign Application Priority Data

Nov. 21, 2018 (JP) .................................. 2018-217876

(51) Int. Cl.
*H01L 25/16* (2006.01)
*H01L 31/105* (2006.01)
(Continued)

(52) U.S. Cl.
CPC .............. *H01L 25/167* (2013.01); *G02B 6/42* (2013.01); *G02B 6/4214* (2013.01); *H01L 23/3736* (2013.01); *H01L 24/80* (2013.01); *H01L 24/94* (2013.01); *H01L 31/02005* (2013.01); *H01L 31/02327* (2013.01); *H01L 31/105* (2013.01); *H04B 10/40* (2013.01); *H01L 2224/80895* (2013.01)

(58) Field of Classification Search
None
See application file for complete search history.

(56) References Cited

U.S. PATENT DOCUMENTS 5,334,804 A * 8/1994 Love ..................... H01L 21/486
174/267
6,479,887 B1 * 11/2002 Yoon ................... H01L 23/3114
257/666

(Continued)

FOREIGN PATENT DOCUMENTS

JP       2017-151146 A       8/2017
WO       2014/156962 A1      10/2014

*Primary Examiner* — David W Lambert
(74) *Attorney, Agent, or Firm* — McDermott Will & Emery LLP

(57) ABSTRACT

The semiconductor module includes a semiconductor chip and a semiconductor chip. The semiconductor chip includes an optical device such as an optical waveguide, an optical receiver, and a grating coupler, and a wiring formed over the optical device. The semiconductor chip includes a semiconductor element such as a MISFET formed in the semiconductor substrate, and a wiring formed over the semiconductor element. a top surface of the semiconductor chip is laminated to a top surface of the semiconductor chip such that the wirings are in direct contact with each other. In the semiconductor substrate, a through hole having a circular shape in plan view is formed, in the through hole, an insulating film is formed as a cladding layer, and the semiconductor substrate surrounded by the through hole constitutes an optical waveguide.

20 Claims, 22 Drawing Sheets

(51) Int. Cl.
  *H01L 31/02*    (2006.01)
  *H01L 31/0232*  (2014.01)
  *H01L 23/373*   (2006.01)
  *H01L 23/00*    (2006.01)
  *G02B 6/42*     (2006.01)
  *H04B 10/40*    (2013.01)

(56) References Cited

U.S. PATENT DOCUMENTS

| | | |
|---|---|---|
| 9,541,718 B2 | 1/2017 | Ogura et al. |
| 2010/0119192 A1* | 5/2010 | Fujikata ............... G02B 6/4204 |
| | | 385/14 |
| 2010/0320496 A1* | 12/2010 | Nishi .................... H01L 23/481 |
| | | 257/98 |
| 2016/0020240 A1* | 1/2016 | Hayashi ............ H01L 27/14623 |
| | | 257/432 |
| 2017/0139142 A1* | 5/2017 | Patel ...................... G02B 6/305 |
| 2018/0227549 A1* | 8/2018 | Cai .................... G02B 6/12002 |

* cited by examiner

SEMICONDUCTOR MODULE AND METHOD OF MANUFACTURING THE SAME, AND METHOD OF COMMUNICATION USING THE SAME

CROSS-REFERENCE TO RELATED APPLICATIONS

The disclosure of Japanese Patent Application No. 2018-217876 filed on Nov. 21, 2018 including the specification, drawings and abstract is incorporated herein by reference in its entirety.

BACKGROUND

The present disclosure relates to a semiconductor module, a method of manufacturing the semiconductor module, and a method of communication using the semiconductor module, and in particular, the present disclosure can be suitably be applied to a semiconductor module for propagating an optical signal and an electric signal.

In recent years, a silicon photonics technique has been developed as a semiconductor device for performing optical communication. In the silicon photonics technique, a transmission line for an optical signal comprised of a semiconductor material as silicon is formed on a semiconductor substrate, and a photonics chip in which various optical devices formed by the transmission line for the optical signal and electronic devices are integrated is used. Further, integration of a semiconductor module that performs propagation of optical and electrical signals by mounting a driver chip for controlling the photonics chip on the photonics chip has been studied.

Japanese Patent Application Publication No. 2017-151146 and WO 2014/156962 disclose a technique of mounting driver chips on a substrate on which optical device such as optical waveguide is formed.

In a semiconductor module for optical communication having a photonics chip, the size of the photonics chip is often larger than the size of a driver chip on which an electronic circuit composed of semiconductor elements is formed. This is because, in the photonics chip, the propagation loss is very small even if the transmission distance of light becomes long, and therefore, in the driver chip, the shortest transmission distance of electricity can reduce the overall propagation loss and minimize the power consumption. Further, it is possible to input and output lights from the direction of the upper surface side of the photonics chip or the direction of the side surface side of the photonics chip.

However, in such a semiconductor module that performs propagation of an optical signal and an electrical signal, it is difficult to maximize the data transmission amount (band density) per volume between the photonics chip and the driver chip, and to improve the efficiency (power consumption per information amount) of data transmission energy. In addition, since the degree of design freedom for high integration of the semiconductor module is low, there is a problem that it is difficult to cope with miniaturization of the semiconductor module.

Other objects and novel features will become apparent from the description of this specification and the accompanying drawings.

SUMMARY

According to embodiments, the semiconductor module includes a first semiconductor chip comprising: an optical device; and a first wiring formed over the optical device and electrically connected with the optical device; and a second semiconductor chip comprising: a substrate; a semiconductor element formed on a top surface side of the substrate and forming a part of an electric circuit, a second wiring formed over the semiconductor element and electrically connected with the semiconductor element; wherein the second semiconductor chip is mounted on the first semiconductor chip, wherein a top surface of the first semiconductor chip is laminated with a top surface of the second semiconductor chip such that the first wiring and the second wiring are in direct contact with each other; wherein a through hole having a circular shape in plan view is formed in the substrate; wherein a first cladding layer is formed in the through hole; and wherein the first cladding layer is comprised of a material having a refractive index smaller than that of the material constituting the substrate surrounded by the through hole.

According to embodiments, the performance of the semiconductor module can be improved.

DETAILED DESCRIPTION

Figure 1:
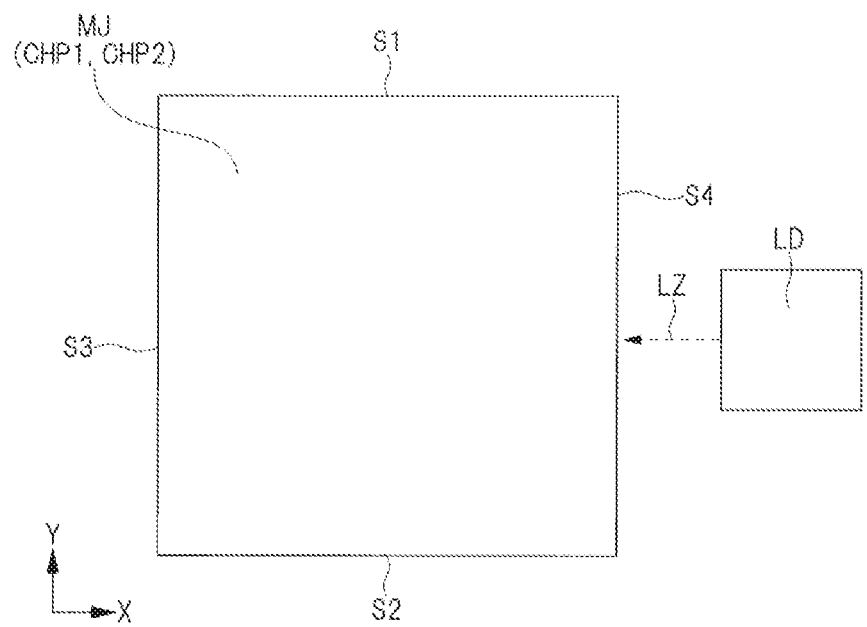
FIG. 1 is a plan view illustrating a semiconductor module according to first embodiment.

In the following embodiments, when required for convenience, the description will be made by dividing into a plurality of sections or embodiments, but except when specifically stated, they are not independent of each other, and one is related to modifications, detail, supplementary description, or the like of part or all of the other. In the following embodiments, reference to the number of elements or the like (including the number, numerical value, quantity, range, and the like) is not limited to the specific number, and may be greater than or equal to the specific number or less, except in the case where it is specifically specified and the case where it is obviously limited to the specific number in principle. Furthermore, in the following embodiments, it is needless to say that the constituent elements (including the element steps and the like) are not necessarily essential except in the case where they are specifically specified and the case where they are considered to be obviously essential in principle. Similarly, in the following embodiments, reference to shapes, positional relationships, and the like of constituent elements and the like includes substantially approximate or similar shapes and the like, except for the case in which they are specifically specified and the case in which they are considered to be obvious in principle and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary. In addition, in the cross-sectional view used in the embodiment, hatching or the like may be omitted in order to make the drawing easier to see.

In the following embodiment, when expressing "B positioned directly under A" or the like, the relationship between A and B includes the case where they are in direct contact with each other and the case where there are other components between them. In other words, the relationship between A and B means that they overlap in plan view. The same relationship holds when expressing "right above" instead of "right below".

First Embodiment

Figure 2:
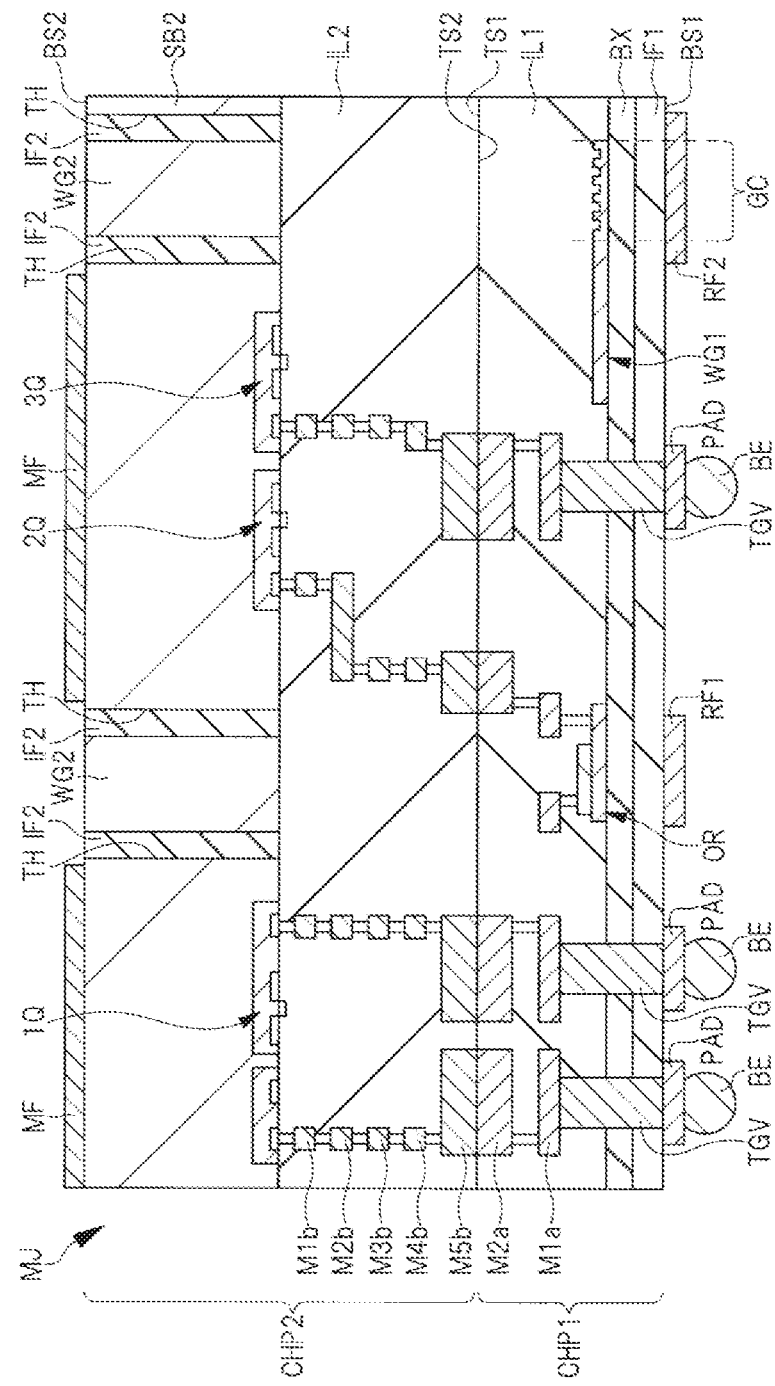
FIG. 2 is a cross-sectional view illustrating the semiconductor module according to first embodiment.
Figure 3:
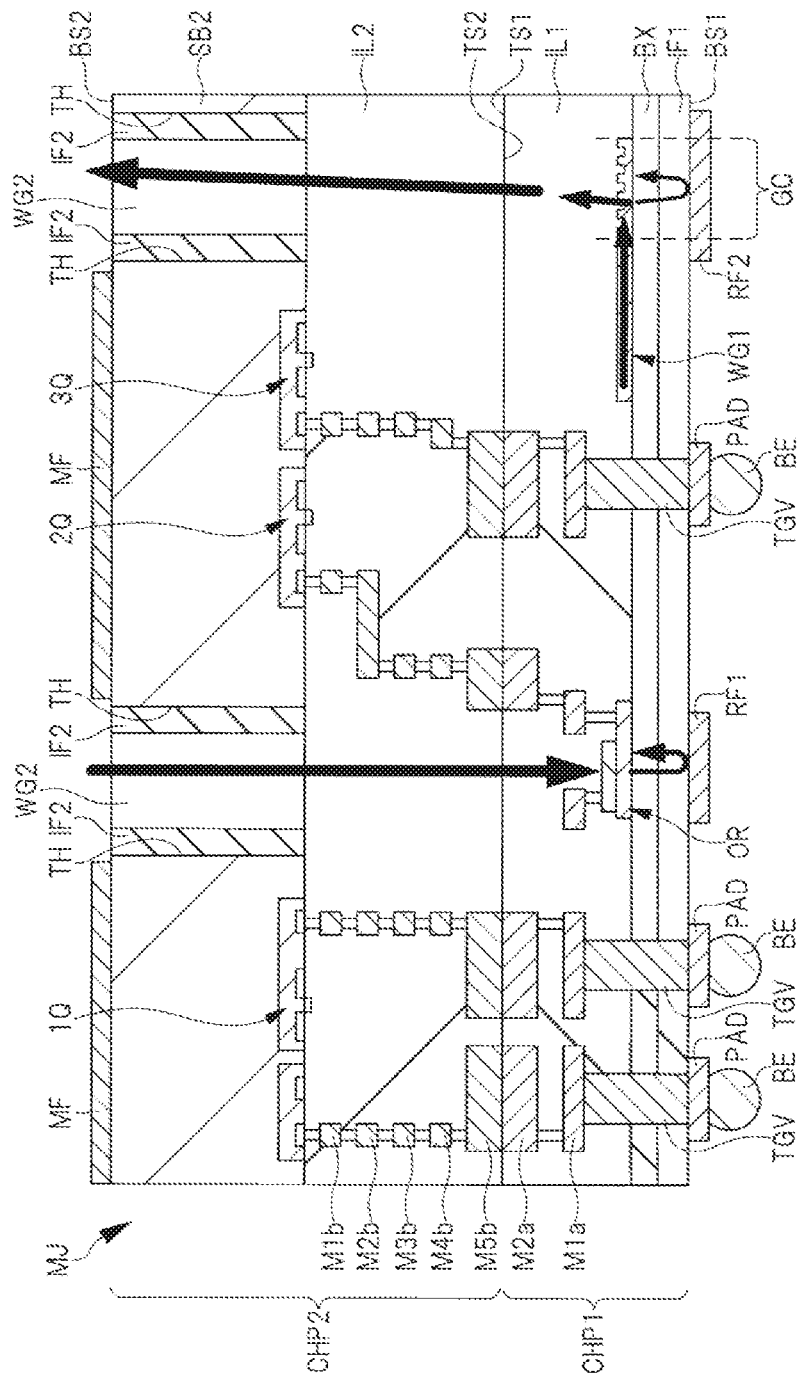
FIG. 3 is a cross-sectional view illustrating the semiconductor module according to first embodiment.
Figure 4:
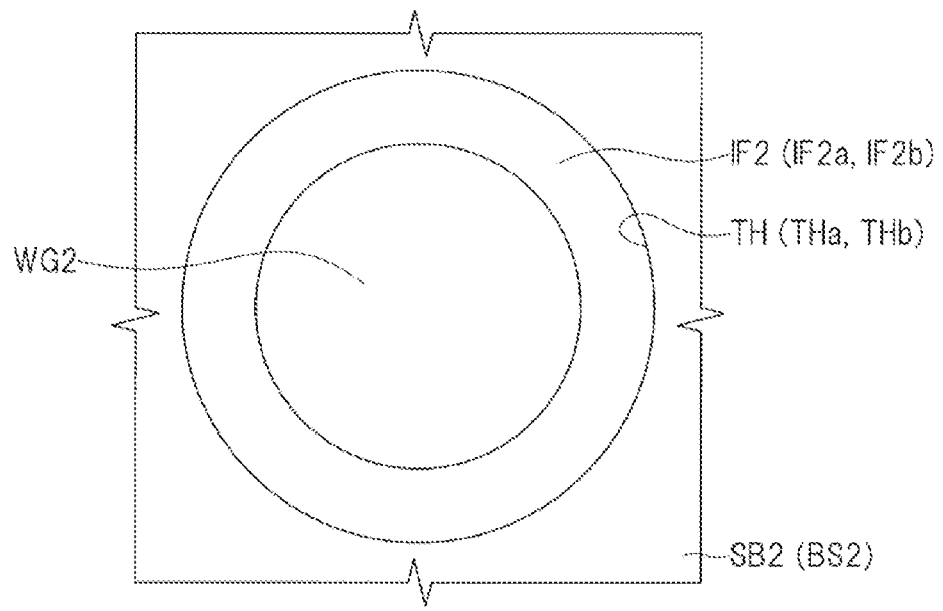
FIG. 4 is a main portion plan view illustrating an optical waveguide of first embodiment.

FIG. 1 shows a plan view of a semiconductor module MJ which is a semiconductor device capable of propagating an optical signal and an electric signal, and FIG. 2 shows a cross-sectional view of the semiconductor module MJ. FIG. 3 is a cross-sectional view similar to FIG. 2, but the states of the light input and the light output are indicated by arrows, and some hatching is omitted in FIG. 3 in order to make them easy to see. FIG. 4 is a main portion plan view of the optical waveguide WG2 formed on the semiconductor chip CHP2 as viewed from the back surface BS2 of the semiconductor chip CHP2.

The semiconductor module MJ includes a semiconductor chip CHP1 and a semiconductor chip CHP2 mounted on the semiconductor chip CHP1. The semiconductor chip CHP1 is a photonics chip with optical devices such as optical waveguides. The semiconductor chip CHP2 is a driver chip that transmits electrical signals to the semiconductor chip CHP1 and includes electrical circuits such as Central Processing Unit (CPU).

As shown in FIG. 1, a laser diode chip LD having a light-emitting portion that emits laser light LZ is provided outside the semiconductor module MJ as an example of an optical communication device. The semiconductor chip CHP1 of the semiconductor module MJ can receive the laser light LZ from the laser diode chip LD directly or via optical fibers or the like, and can transmit and receive optical signals to and from optical communication equipment outside the semiconductor module MJ. That is, it can be said that the semiconductor module MJ is an interposer for optical communication capable of transmitting and receiving light.

As will be described later in detail, the planar size of the semiconductor chip CHP1 is substantially the same as the planar size of the semiconductor chip CHP2. As shown in FIG. 1, in planar view, the semiconductor module MJ has a first side S1 and a second side S2 along the X-direction, and a third side S3 and a fourth side S4 along the Y-direction, and a semiconductor chip CHP1 and a semiconductor chip CHP2 have corresponding first side S1 to fourth side S4. The X direction and the Y direction cross each other and are orthogonal to each other.

Here, when exemplified using the first side S1, in plan view, a position of the first side S1 of the semiconductor chip CHP1 coincides with the position of the first side S1 of the semiconductor chip CHP2 within 5 μm. Such a relationship is the same for each of the second side S2 to the fourth side S4.

That is, in plan view, the outer periphery of the semiconductor chip CHP1 coincides with the outer periphery of the semiconductor chip CHP2 within a predetermined range, and specifically coincides with the outer periphery of the semiconductor chip CHP2 within a range of 5 μm. In other words, the side surface of the semiconductor chip CHP1 and the side surface of the semiconductor chip CHP2 are flush with each other. In other words, the deviation between the positions of the first side S1 to the fourth side S4 of the semiconductor chip CHP1 and the positions of the first side S1 to the fourth side S4 of the semiconductor chip CHP2 is 5 μm or less, respectively.

In the following present embodiment, when the planar size of the semiconductor chip CHP1 and the planar size of the semiconductor chip CHP2 are the same or substantially the same, as described above, it means that the outer periphery of the semiconductor chip CHP1 coincides with the outer periphery of the semiconductor chip CHP2 within a range of 5 μm.

The structures of the semiconductor chips CHP1 and CHP2 included in the present embodiment semiconductor modules MJ will be described below with reference to FIGS. 2 to 4. As shown in FIG. 2, the semiconductor chip CHP1 has a top surface TS1 and a back surface BS1, and the semiconductor chip CHP2 has a top surface TS2 and a back surface BS2. The top surface TS1 and the top surface TS2 are opposite and laminated to each other. That is, FIG. 2 shows a state in which the semiconductor chip CHP2 is inverted.

A plurality of optical devices (optical semiconductor elements) are formed on the semiconductor chip CHP1, and present embodiment shows an optical waveguide WG, an optical receiver OR, and a grating coupler GC as examples of such optical devices. As another optical device (not shown), for example, an optical modulator can be cited.

The optical waveguide WG, the optical receiver OR, and the grating coupler GC are formed on the insulating film BX, respectively, and are formed by processing the same semiconductor layer. Such a semiconductor layer is comprised of, for example, silicon and has a thickness of, for example, 200 to 300 nm. The insulating layer BX is comprised of, for example, silicon oxide and has a thickness of, for example, 500 nm to 3 μm.

The optical waveguide WG is mainly a propagation path of an optical signal for optically connecting each optical device, and is integrally connected to other optical devices such as a optical receiver OR and a grating coupler GC.

The optical receiver OR includes, for example, a semiconductor layer into which a p-type impurity is introduced, and an i-type germanium layer formed on the p-type semiconductor layer and having an n-type surface, and a pin structure is formed by these layers. The n-type germanium layer and the p-type semiconductor layer are electrically connected to the upper wiring M1 a via plugs or the like, respectively. As a result, the direct current flowing by the photovoltaic effect in the pin structure can be taken out to the outside of the optical receiver OR.

The grating coupler GC is an optical device that couples laser light entering from an optical communication device outside the semiconductor module MJ to light propagating through the optical waveguide WG1, or emits light propagating through the optical waveguide WG1 to an optical communication device outside the semiconductor module MJ. The light propagating through the grating coupler GC is subjected to periodic refractive index modulation (waveguide grating) in the concave portion (groove portion) and convex portion (protrusion portion) provided on the optical waveguide surface along the propagation direction, and is diffracted and radiated in a specific direction. In the present embodiment, the concave portion and the convex portion of the grating coupler GC are provided toward the top surface TS1 side of the semiconductor chip CHP1. Therefore, the diffracting direction of the light is dominated by the direction toward the top surface TS1.

As will be described later, a through hole TH is formed in the semiconductor substrate SB2 of the semiconductor chip CHP2, and an optical waveguide WG2 is formed in the through hole TH. In the present embodiment, each of the optical receiver OR and the grating coupler GC is provided directly below the optical waveguide WG2. In other words, each of the optical receiver OR and the grating coupler GC is formed at a position overlapping with the optical waveguide WG2 in plan view.

In FIG. 3, the propagation path of light is schematically indicated by arrows. Light from an optical communication device outside the semiconductor module MJ enters the optical waveguide WG2, passes through the interlayer insulating film IL2 and the interlayer insulating film IL1, and reaches the optical receiver OR. That is, the optical receiver OR receives the light through the optical waveguide WG2. In present embodiment, light propagating from the optical waveguide WG1 to the grating coupler GC is diffracted upward from the grating coupler GC, and the diffracted light is emitted to an optical communication device outside the semiconductor module MJ through the optical waveguide WG2. When light enters the grating coupler GC from an optical communication device outside the semiconductor module MJ via the optical waveguide WG2, the direction of the arrow is reversed.

A reflective film RF1 and a reflective film RF2 are formed below the optical receiver OR and the grating coupler GC with an insulating film BX and an insulating film IF1 interposed therebetween, respectively. Specifically, the reflective film RF1 is formed directly below the optical receiver OR and is formed at a position overlapping the optical receiver OR in plan view. The reflective film RF2 is formed directly under the grating coupler GC, and is formed at a position overlapping with the grating coupler GC in plan view. Each of the reflective film RF1 and the reflective film RF2 is formed of a metallic film such as a copper film or an aluminum film, for example.

The reflective film RF1 can reflect the light transmitted through the optical receiver OR. Therefore, by receiving the reflected light at the optical receiver OR, it is possible to suppress the light loss.

The reflective film RF2 can reflect the light diffracted downward of the grating coupler GC, and the reflected light enters the optical waveguide WG2 above the grating coupler GC. In the grating coupler GC, the diffraction direction of light is predominantly a direction toward the top surface TS1 side, but there is also light which is not diffracted on the top surface TS1 side of the semiconductor chip CHP1 but diffracted on the back surface BS1 side of the semiconductor chip CHP1. For example, about 50 to 70% of the light is diffracted on the top surface TS1 side, and about 30 to 50% of the light is diffracted on the back surface BS1 side. The light diffracted on the back surface BS1 is directly coupled to optical losses. Therefore, since the light diffracted on the back surface BS1 side is reflected on the top surface TS1 side by providing the reflective film RF2, it is possible to suppress light losses.

When light enters the optical waveguide WG2 from the grating coupler GC, the diffraction direction of the light in the grating coupler GC is generally obliquely upward, but the diffraction direction of the light can be made perpendicular by adjusting the pitches or heights of the concave portions and convex portions constituting the grating coupler GC.

In order to more reliably suppress optical losses, it is preferable that the reflective film RF1 and the reflective film RF2 cover the entire lower surfaces of the optical receiver OR and the grating coupler GC, respectively.

An interlayer insulating film IL1 comprised of, for example, silicon oxide is formed on the optical waveguide WG1, the optical receiver OR, and the grating coupler GC. As described above, the periphery of each of the optical waveguide WG1, the optical receiver OR, and the grating coupler GC is covered with the insulating film BX and the interlayer insulating film IL1 comprised of the same materials. The insulating film BX and the interlayer insulating film IL1 are comprised of a material having a refractive index lower than that of the materials constituting the optical waveguide WG1, the optical receiver OR, and the grating coupler GC. Therefore, the optical waveguide WG1, the optical receiver OR, and the grating coupler GC function as the core layer of the optical device, and the insulating film BX and the interlayer insulating film IL1 function as the cladding layer of the optical device.

An insulating film BX is formed below the optical devices, and an insulating film IF1 comprised of, for example, silicon oxide and having a thickness of, for example, 1 μm to 2 μm is further formed on the lower surface of the insulating film BX.

The insulating film BX and the semiconductor layers used for the optical waveguide WG1, the optical receiver OR, the grating coupler GC, and the like are originally a part of the Silicon On Insulator (SOI) substrate. In present embodiment, the semiconductor substrate (substrate) SB1, which is a supporting substrate of SOI substrate, is removed. At this time, a part of the insulating film BX is also removed, the thickness of the insulating film BX becomes thin, and there is a possibility that the thickness of the insulating film BX cannot be maintained to the extent that the insulating film BX can function as a cladding layer. For this reason, the insulating film IF1 also serves as a cladding layer on the back surface BS1 side of the semiconductor chip CHP1. Incidentally, if this object is sufficiently achieved only by the insulating film BX, the insulating film IF1 is not indispensable.

In the interlayer insulating film IL1, a first wiring M1a and a second wiring M2a are formed over the wiring M1a. Actually, the interlayer insulating film IL1 is formed of a laminated film of a multilayer insulating film, and the wiring M1a and the wiring M2a are formed in the insulating films of the respective layers, but in present embodiment, such a multilayer insulating film is illustrated as an interlayer insulating film IL1. The optical devices are electrically connected with the wiring M1a and the wiring M2a. The wiring M1a and the wiring M2a are wiring of a so-called damascene structure or a dual damascene structure, and are comprised of a conductive film mainly comprised of copper. The damascene structure or the dual damascene structure is a wiring structure formed by forming a groove in an insulating film such as an interlayer insulating film IL1, filling a conductive film mainly comprised of copper in the groove via a barrier metal film such as a tantalum nitride film, and then removing the barrier metal film and the conductive film outside the groove by a Chemical Mechanical Polishing (CMP) method.

Pad electrodes PAD having, for example, a copper film or an aluminum film are formed on a lower surface side of the insulating film IF1, i.e., on the back surface BS1 side of the semiconductor chip CHP1. The pad electrode PAD is electrically connected with the wiring Mia through the through electrode TGV. The through electrodes TGV are formed by embedding a conductive film comprised of copper, for example, in a hole formed by penetrating the insulating film BX and the insulating film IF1 and removing a portion of the interlayer insulating film IL1 so that the through electrodes TGV reach the wiring M1a from the back surface BS1.

A bump electrode BE comprised of solder, for example, is formed on the lower surface of the pad electrode PAD as an external connection terminal. Although not shown, the bump electrode BE is connected to other wiring substrate or other semiconductor chips. Accordingly, the semiconductor chip CHP1 can transmit electrical signals to electrical devices outside the semiconductor modules MJ, such as other wiring substrate or other semiconductor chips.

A plurality of semiconductor elements constituting a part of electric circuits are formed on the semiconductor chip CHP2, and present embodiment shows MISFET1Q~3Q as examples of such semiconductor elements.

A semiconductor substrate (substrate) SB2 comprised of silicon into which a p-type impurity is introduced is provided on the back surface BS2 of the semiconductor chip CHP2. Therefore, the back surface of the semiconductor substrate SB2 is the back surface BS2 of the semiconductor chip CHP2.

A plurality of well regions are formed on the top surface side of the semiconductor substrate SB2, n-type or p-type diffused layers are formed in each well region, and a MISFET1Q~3Q having gate dielectric film and gate electrodes is formed in the plurality of well regions.

An interlayer insulating film IL2 is formed on the semiconductor substrate SB2 so as to cover a semiconductor element such as MISFET1Q~3Q, and a multi-layer wiring layer is formed on the semiconductor element in the interlayer insulating film IL2. In FIG. 2, the wiring M1b to M5b are shown as such multi-layer wiring layers, and the semiconducting elements are electrically connected with the wiring M1b to M5b. The structure of the wiring M1b to M5b is, for example, a damascene structure or a dual damascene structure, like the wiring Mia and the wiring M2a of the semiconductor chip CHP1. The interlayer insulating film IL2 actually consists of a multilayer insulating film, and the wiring M1b to M5b are formed in the insulating films of the respective layers; however, in present embodiment, such multilayer insulating films are illustrated as the interlayer insulating film IL2.

A through hole TH reaching the interlayer insulating film IL2 from the back surface BS2 is formed in the semiconductor substrate SB2. As shown in FIG. 4, a shape of the through hole TH in plan view is annular. An insulating film IF2 comprised of, for example, silicon oxide is formed in the through hole TH. The semiconductor substrate SB2 surrounded by the insulating film IF2 constitutes the optical waveguide WG2. The insulating film IF2 is comprised of a material having a refractive index lower than the refractive index of the material constituting the optical waveguide WG2, and the optical waveguide WG2 is surrounded by the insulating film IF2. Therefore, since the optical waveguide WG2 can function as a core layer and the insulating film IF2, which is a constituent surrounding the optical waveguide WG2, can function as a cladding layer, light can enter and exit from the optical communication device outside the semiconductor module MJ via the optical waveguide WG2 as described above.

The through hole TH includes a first hole THa and a second hole THb formed in the semiconductor substrate SB2, and the first hole THa and the second hole THb communicate with each other, as will be described in detail later in the manufacturing process. That is, the first hole THa is a first portion of the through hole TH, and is a portion close to the front surface of the semiconductor substrate SB2. The second hole THb is a second portion of the through hole TH, and is a portion closer to the back surface of the semiconductor substrate SB2 than the first portion.

Although the planar shape of the through hole TH is annular, such an annular shape may be a polygonal shape such as a circular shape, an elliptical shape, or an octagonal shape. However, in view of the isotropy of diffracted light propagating in the optical waveguide WG2, a circular shape is most preferable as a ring shape. The width of the through hole TH, that is, the difference between the outer diameter and the inner diameter of the through hole TH is, for example, 7 to 30 μm. The width of the optical waveguide WG2, that is, the inner diameter of the through hole TH is 10 μm to 100 μm.

The insulating film IF2 includes an insulating film IF2a formed in the first hole THa and an insulating film IF2b formed in the second hole THb, and the insulating film IF2a and the insulating film IF2b are integrated. As described above, the insulating film IF2a and the insulating film IF2b which are components surrounding the optical waveguide WG2 can function as cladding layers, respectively.

Although it is preferable that the inside of the through hole TH is completely filled with the insulating film IF2, a thickness of the insulating film IF2 is sufficient as long as it can function as a cladding layer. For example, the inside of the through hole TH may not be completely filled with the insulating film IF2, and a hole may be formed in the through hole TH, and the thickness of the insulating film IF2 between the hole and the side surface of the through hole TH may be kept sufficiently thick.

A metallic film MF comprised of, for example, titanium nitride or tungsten is formed on the back surface of the semiconductor substrate SB2. The metallic film MF is formed in a region other than the semiconductor substrate SB2 surrounded by the through hole TH, and the metallic film MF is formed so as to selectively expose the optical waveguide WG2. Therefore, in the optical waveguide WG2, it is possible to prevent light from entering the semiconductor substrate SB 2 other than the optical waveguide WG2 or light from exiting the semiconductor substrate SB2 other than the optical waveguide WG2 when light enters or exits the optical communication device outside the semiconductor module MJ. That is, the metallic film MF functions as a light shielding film.

In addition, since the metallic film MF comprised of a material having higher thermal conductivity than the material constituting the semiconductor substrate SB2 is provided on the back surface BS2 side of the semiconductor chip CHP2, the heat dissipation effect of the semiconductor chip CHP2 can be enhanced.

The semiconductor module MJ in present embodiment has a semiconductor chip CHP1 and a semiconductor chip CHP2, and the top surface TS1 of the semiconductor chip CHP1 and the surface TS2 of the semiconductor chip CHP2 are bonded to each other. Specifically, the upper surface of the interlayer insulating film IL1 of the semiconductor chip CHP1 is bonded to the upper surface of the interlayer insulating film IL2 of the semiconductor chip CHP2, and the upper surface of the wiring M2a which is the uppermost layer wiring of the semiconductor chip CHP1 is bonded to the upper surface of the wiring M5b which is the uppermost layer wiring of the semiconductor chip CHP2.

In this manner, the semiconductor chip CHP1 and the semiconductor chip CHP2 can transmit electric signals via the wiring M2a and the wiring M5b which are in direct contact with each other. In addition, electrical signals can be transmitted from an electrical device (such as a wiring substrate or other semiconductor chip) outside the semiconductor chip CHP1 to the semiconductor chip CHP2 via the bump electrodes BE of the semiconductor chip CHP1. The semiconductor chip CHP1 can transmit and receive light to and from an optical communication device outside the semiconductor module MJ, such as a laser diode chip LD or an optical fiber.

Hereinafter, a communication method between the semiconductor module MJ and optical communication devices and electrical devices outside the semiconductor module MJ will be described.

When converting an electric signal into an optical signal, first, a first electric signal from an electric device outside the semiconductor module MJ is received in the semiconductor chip CHP1 via the bump electrode BE, the through electrode TGV, and the wiring Mia. Next, the first electric signal received by the semiconductor chip CHP1 is transmitted from the semiconductor chip CHP1 to the semiconductor chip CHP2 via the wiring M2a and the wiring M5b. Next, the first electric signal received by the semiconductor chip CHP2 is processed into a second electric signal or the like by using the MISFETs 1Q~3Q of the semiconductor chip CHP2 or the like. Next, the second electric signal is transmitted from the semiconductor chip CHP2 to the semiconductor chip CHP1. Next, the second electric signal received by the semiconductor chip CHP1 is converted into an optical signal by using the optical devices of the semiconductor chip CHP1. Thereafter, the optical signal is diffracted by the grating coupler GC of the semiconductor chip CHP1, and the diffracted optical signal is transmitted to an optical communication device (such as an optical fiber) outside the semiconductor module MJ via the optical waveguide WG2 of the semiconductor chip CHP2.

In the case of converting an optical signal into an electric signal, a communication path opposite to the above may be followed. That is, first, an optical signal from an optical communication device (such as an optical fiber) outside the semiconductor module MJ is received by the optical receiver OR or the grating coupler GC of the semiconductor chip CHP1 via the optical waveguide WG2 of the semiconductor chip CHP2. Next, the optical signal received by the semiconductor chip CHP1 is converted into a third electric signal by using the optical devices of the semiconductor chip CHP1. Next, the third electric signal is transmitted from the semiconductor chip CHP1 to the semiconductor chip CHP2. Next, the third electric signal received by the semiconductor chip CHP2 is processed into a fourth electric signal or the like by using the MISFETs 1Q~3Q of the semiconductor chip CHP2 or the like. Thereafter, the fourth electric signal is transmitted to the electric devices outside the semiconductor modules MJ via the bump electrodes BE, the through electrodes TGV, the wiring Mia and the wiring M2a of the semiconductor chips CHP1.

In the prior art, the planar size of the semiconductor chip CHP1, which is a photonic chip, is formed to be larger than the planar size of the semiconductor chip CHP2, which is a driver chip, as shown in the above-mentioned prior art documents and the like.

On the other hand, in present embodiment, as described with reference to FIG. 1, the planar size of the semiconductor chip CHP1 and the planar size of the semiconductor chip CHP2 are the same. More specifically, in plan view, the outer periphery of the semiconductor chip CHP1 coincides with the outer periphery of the semiconductor chip CHP2 within a range of 5 μm.

Therefore, since the mounting densities of the semiconductor chip CHP1 and the semiconductor chip CHP2 are maximized, the data transmission quantity per unit volume can be maximized between the two chips, and the efficiency of the data transmission energy can be improved. Accordingly, the performance of the semiconductor modules MJ having the semiconductor chip CHP1 and the semiconductor chip CHP2 can be improved.

In addition, since the planar size of the semiconductor chip CHP1 can be made the same as the planar size of the semiconductor chip CHP2, the semiconductor module MJ can be highly integrated, and miniaturization of the semiconductor module MJ can be achieved.

Further, in the prior art, as shown in the above-mentioned prior art document, since the photonics chip is bonded to the driver chip via only the interlayer insulating film, the bonding strength of the photonics chip and the driver chip is not sufficient.

On the other hand, in present embodiment, the wiring M2a of the semiconductor chip CHP1 and the wiring M5b of the semiconductor chip CHP2 are directly bonded to each other in the top surface TS1 of the semiconductor chip CHP1 and the top surface TS2 of the semiconductor chip CHP2. Therefore, the resistivity between the semiconductor chip CHP1 and the semiconductor chip CHP2 can be minimized, and the bonding strength between the semiconductor chip CHP1 and the semiconductor chip CHP2 can be increased. Therefore, it is possible to maximize the efficiency of the data transmission energy between the semiconductor chip CHP1 and the semiconductor chip CHP2.

Connections between the semiconductor chip CHP1 and the semiconductor chip CHP2 can be achieved by routing the stacked wiring composed of the wiring M2a and the wiring M5b. That is, since the wiring can be routed to a desired position in the semiconductor chip CHP1 and the semiconductor chip CHP2 by the thick laminated wiring, the degree of flexibility in designing is increased and the wiring resistivity can be suppressed to a low level.

In present embodiment, a through hole TH is formed in the semiconductor substrate SB2 of the semiconductor chip CHP2, an optical waveguide WG2 is formed in the through hole TH, and a optical receiver OR or a grating coupler GC is formed immediately below the optical waveguide WG2. Therefore, the present embodiment semiconductor module MJ can input and output optical signals to and from the optical communication device outside the semiconductor module MJ via the optical waveguide WG2 provided above each of the optical receiver OR and the grating coupler GC.

Therefore, since the optical devices in the CHP2 of the semiconductor chip can be appropriately arranged in accordance with the position where the optical waveguide WG2 is formed, the optical transmission length does not need to be increased as in the conventional art. Therefore, in the semiconductor chip CHP2, the degree of flexibility in designing the optical device can be improved, and the mounting density of the optical device can be increased. In addition, since the transmission distances between the semiconductor elements such as the MISFETs 1Q~3Q in the semiconductor chip CHP1 and the optical devices in the semiconductor chip CHP2 can be shortened, it is possible to improve the efficiency of the data transmission energy between the two chips.

As described above, according to the present embodiment, the performance of the semiconductor module MJ can be improved.

Figure 5:
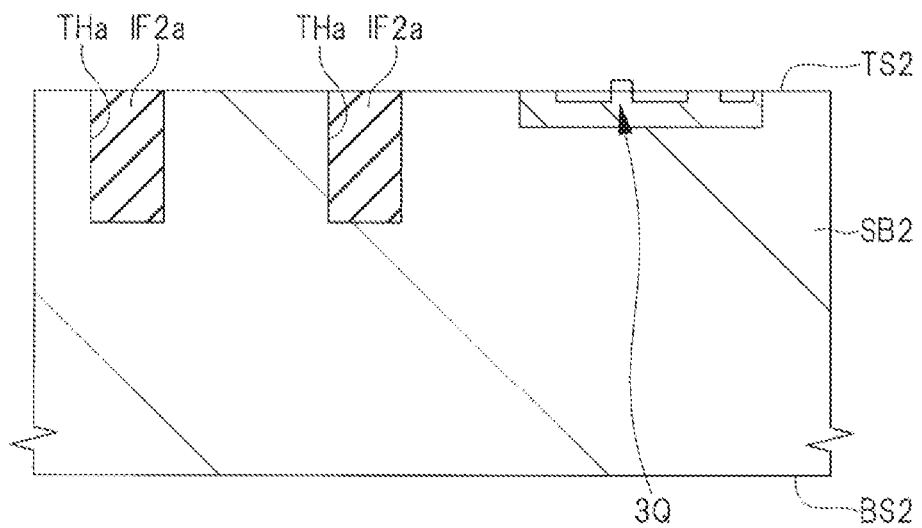
FIG. 5 is a cross-sectional view illustrating a step of manufacturing method of a semiconductor chip according to first embodiment.
Figure 6:
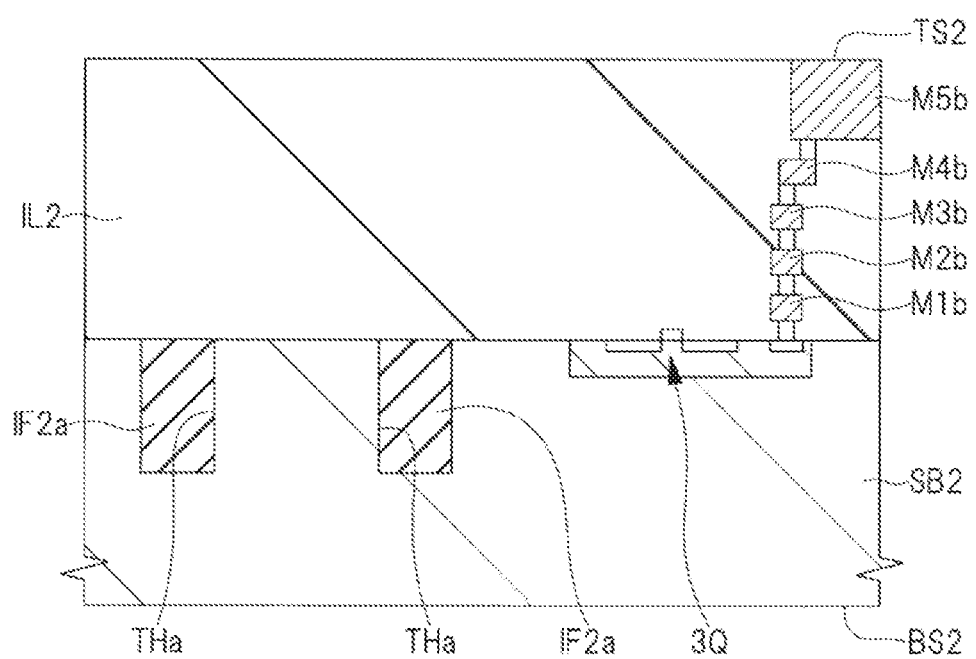
FIG. 6 is a cross-sectional view illustrating a manufacturing step following FIG. 5.
Figure 7:
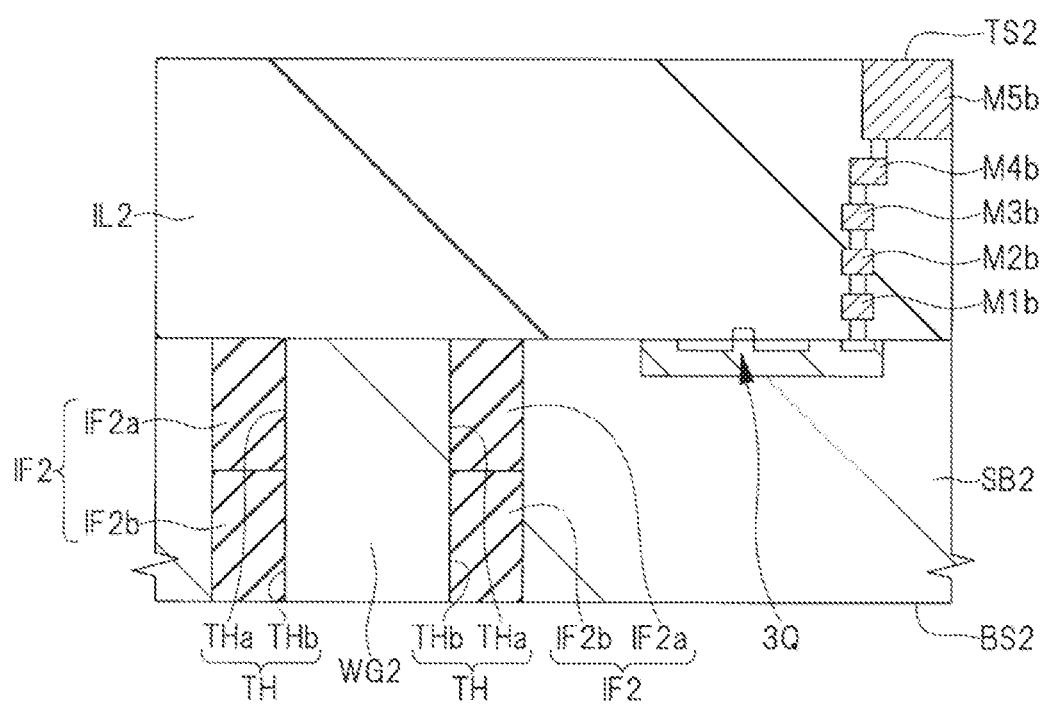
FIG. 7 is a cross-sectional view illustrating a manufacturing step following FIG. 6.

The method of manufacturing the optical waveguide WG2 included in the present embodiment semiconductor chip CHP2 will be described below with reference to FIGS. 5 to 7. In FIGS. 5 to 7, only the periphery of the region of the semiconductor chip CHP2 where one optical waveguide WG2 is formed is shown enlarged.

First, as shown in FIG. 5, a first hole THa to be a part of the through hole TH is formed in the semiconductor substrate SB2 by a photolithography technique and a dry-etching process. That is, the first hole THa is a first portion of the through hole TH. The first hole THa does not penetrate the semiconductor substrate SB 2, and is formed from the surface of the semiconductor substrate SB 2 (the top surface TS2 of the semiconductor chip CHP2) to the inside of the semiconductor substrate SB 2.

The planar shape of the first hole THa is the same as the shape of the through hole TH shown in FIG. 4, and is annular. Like the through hole TH, the first hole THa most preferably has a circular shape. The width of the first hole THa, that is, the difference between the outer diameter and the inner diameter of the first hole THa is, for example, 7 to 30 μm, and the inner diameter of the first hole THa is, for example, 10 to 100 μm. The depth of the first hole THa is, for example, 65 to 170 μm.

Next, an insulating film IF2a comprised of, e.g., silicon oxide is formed on the semiconductor substrate SB2 by, e.g., CVD (Chemical Vapor Deposition) so as to fill the first hole THa. Next, the insulating film IF2a formed outside the first hole THa is removed by a CMP method polishing process so that the insulating film IF2a in the first hole THa remains.

Thereafter, semiconductor elements are formed on the front surfaces of the semiconductor substrate SBs 2. Here, only a MISFET 3Q is shown as a semi-conductor device.

Next, as shown in FIG. 6, a multi-layer insulating film and a multi-layer wiring layer are formed on the semiconductor substrate SB2 so as to cover a semiconductor device such as a MISFET 3Q. As such a multi-layer wiring layer, wirings M1b to M5b are shown, and the semiconducting elements are electrically connected to wirings M1b to M5b. The structure of the wirings M1b to M5b is, for example, a damascene structure or a dual damascene structure. Actually, the wirings M1b to M5b are formed in the insulating film of each layer, but in present embodiment, such a multilayered insulating film is illustrated as an interlayer insulating film IL2. Thereafter, the back surface of the semiconductor substrate SB2 (the back surface BS2 of the semiconductor chip CHP2) is polished to reduce the thickness of the semiconductor substrate SB2.

Next, as shown in FIG. 7, a second hole THb to be a part of the through hole TH is formed in the semiconductor substrate SB2 by photolithography and dry etching. The second hole THb is formed so as to reach the first hole THa from the back surface of the semiconductor substrate SB2. As a result, the first hole THa and the second hole THb communicate with each other, and a through hole TH including the first hole THa and the second hole THb is formed. That is, the second hole THb is a second portion of the through hole TH.

The planar shape of the second hole THb is preferably the same as the planar shape of the first hole THa. The width of the second hole THb, that is, the difference between the outer diameter and the inner diameter of the second hole THb is, for example, 7 to 30 μm, and the inner diameter of the second hole THb is, for example, 10 to 100 μm. The depth of the second hole THb is, for example, 65 to 170 μm. It is most preferable that the formation position of the first hole THa coincides with the formation position of the second hole THb, but the formation position of the first hole THa and the formation position of the second hole THb may be slightly shifted as long as the light in the optical waveguide WG2 is propagated normally.

Next, an insulating film IF2b comprised of, e.g., silicon oxide is formed on the back surface of the semiconductor substrate SB2 by, e.g., CVD so as to fill the second hole THb. Next, the insulating film IF2b formed outside the second hole THb is removed by a CMP method polishing process so that the insulating film IF2b in the second hole THb remains. Thereby, the insulating film IF2a and the insulating film IF2b are integrated in the through hole TH, and an insulating film IF2 including the insulating film IF2a and the insulating film IF2b is formed.

Through the above manufacturing step, the through hole TH is formed in the semiconductor substrate SB2, and the insulating film IF2 is formed in the through hole TH. The semiconductor substrate SB2 surrounded by the insulating film IF2 serves as an optical waveguide WG2.

A method of manufacturing the semiconductor module MJ Hereinafter, a method of manufacturing semiconductor module MJ according to the present embodiment will be described with reference to FIGS. 8 to 11. Although FIGS. 8 to 11 will be described focusing on a region where the semiconductor module MJ of FIG. 2 is finally formed, in actuality, FIGS. 8 to 11 are a cross-sectional view of a manufacturing step in a wafer state in which a plurality of regions where the semiconductor module MJ is formed are provided.

Figure 8:
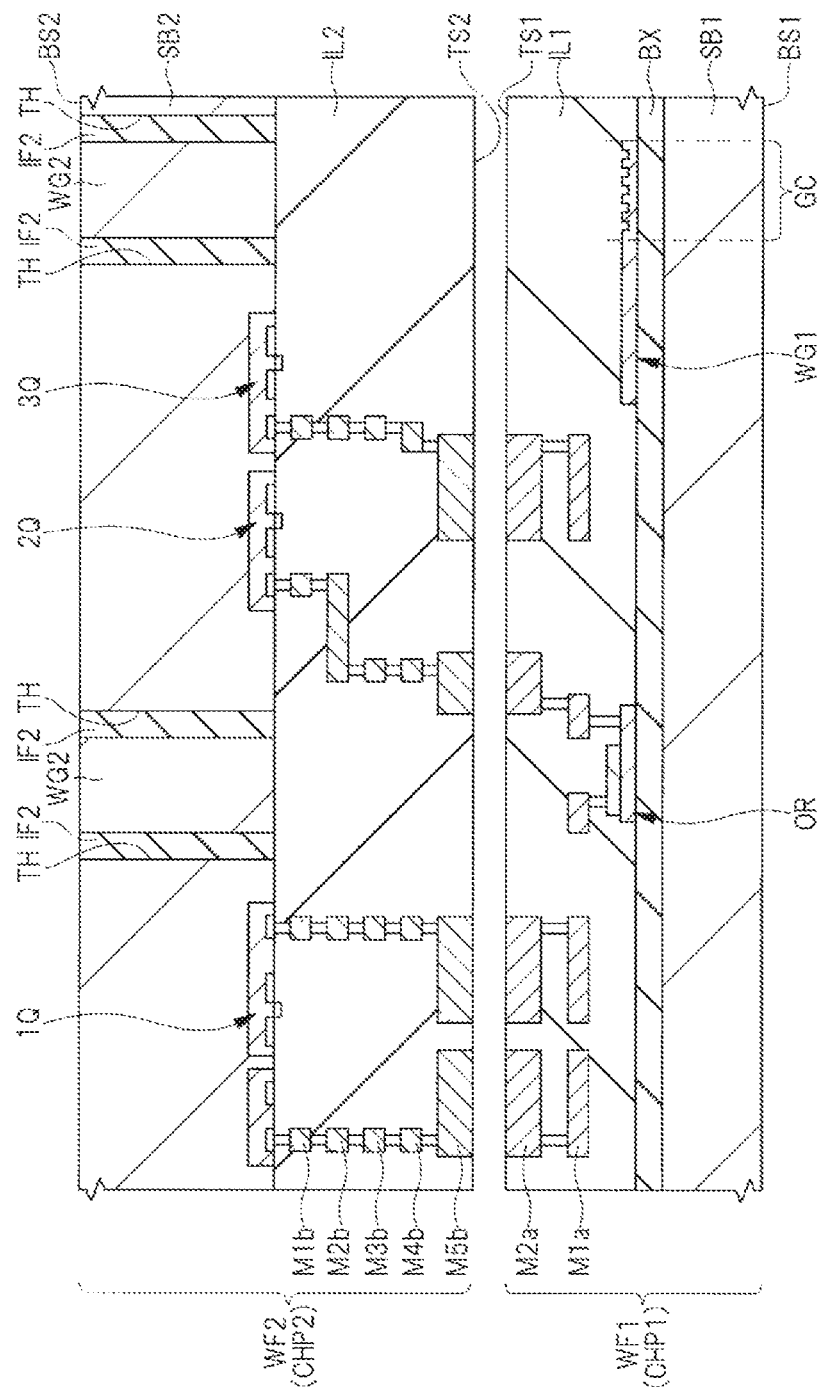
FIG. 8 is a cross-sectional view illustrating a manufacturing step of the semiconductor module according to first embodiment.

First, as shown in FIG. 8, a wafer WF1 having a plurality of regions to be semiconductor chips CHP1 and a wafer WF2 having a plurality of regions to be semiconductor chips CHP2 are provided.

On the wafer WF1, the insulating film BX is formed on the semiconductor substrate SB1, and optical devices (such as an optical waveguide WG, a optical receiver OR, and a grating coupler GC), the interlayer insulating film IL1, the wiring M1a, and a wiring M2a are formed on the insulating film BX. The semiconductor layers used for the semiconductor substrate SB 1, the insulating film BX, the optical waveguide WG, the optical receiver OR, the grating coupler GC, and the like are part of SOI substrate.

On the wafer WF2, as described with reference to FIGS. 5 to 7, through holes TH, semiconducting elements such as optical waveguides WG2 and MISFETs 1Q~3Q, interlayer insulating films IL2 and wiring M2a to M5b are formed.

After preparing the wafer WF1 and the wafer WF2, the wafer WF2 is reversed with respect to the wafer WF1 or the wafer WF1 is reversed with respect to the wafer WF2 so that the top surface TS1 of the wafer WF1 and the top surface TS2 of the wafer WF2 face each other.

Figure 9:
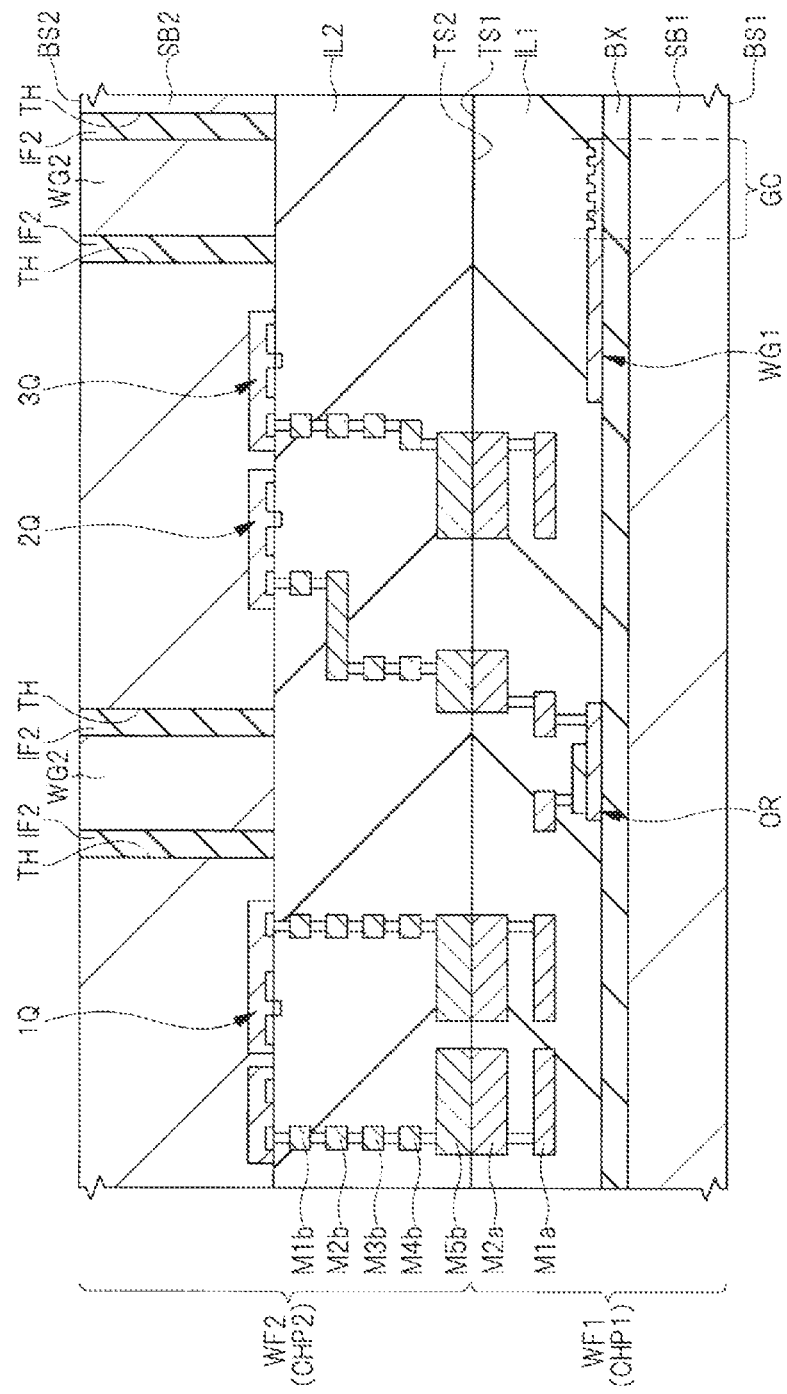
FIG. 9 is a cross-sectional view illustrating a manufacturing step following FIG. 8.

Next, as shown in FIG. 9, the top surface TS1 of the wafer WF1 and the top surface TS2 of the wafer WF2 are bonded to each other. At this time, the wafer WF1 and the wafer WF2 are aligned so that the region to be the semiconductor chip CHP1 overlaps the region to be the semiconductor chip CHP2. As a result, the interlayer insulating films IL1 and wiring M2a on the wafer WF1 are laminated to the interlayer insulating films IL2 and wiring M5b on the wafer WF2, respectively. Further, the wafer WF1 and the wafer WF2 are laminated so that the optical waveguide WG2 of the semiconductor chip CHP2 is positioned directly above each of the optical receiver OR and the grating coupler GC of the semiconductor chip CHP1. In other words, the wafer WF1 and the wafer WF2 are laminated so that the optical receiver OR and the grating coupler GC of the semiconductor chip CHP1 overlap with the optical waveguide WG2 of the semiconductor chip CHP2 in plan view.

Figure 10:
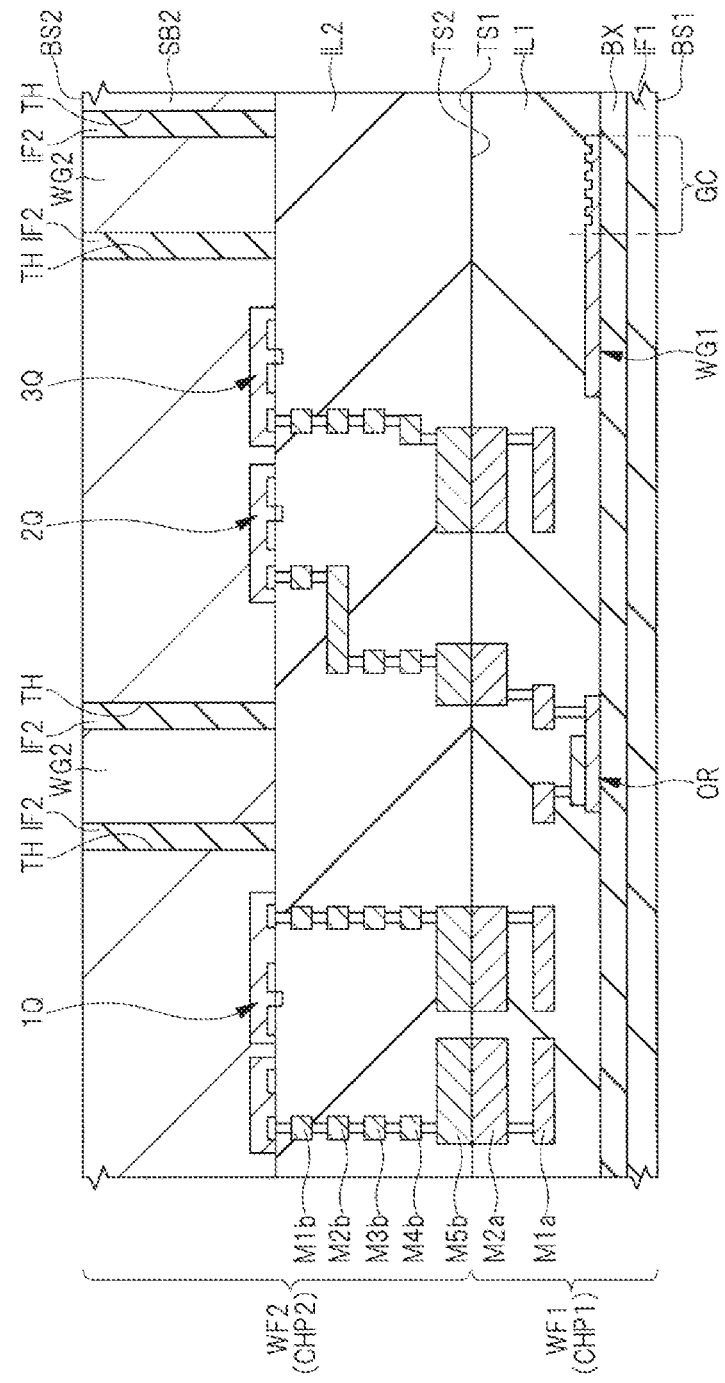
FIG. 10 is a cross-sectional view illustrating a manufacturing step following FIG. 9.

Next, as shown in FIG. 10, the back BS1 of the wafer WF1 is polished to remove the semiconductor substrate SB1, thereby exposing the insulating film BX. Next, an insulating film IF1 comprised of silicon oxide is formed on the lower surface of the insulating film BX by, e.g., CVD.

Figure 11:
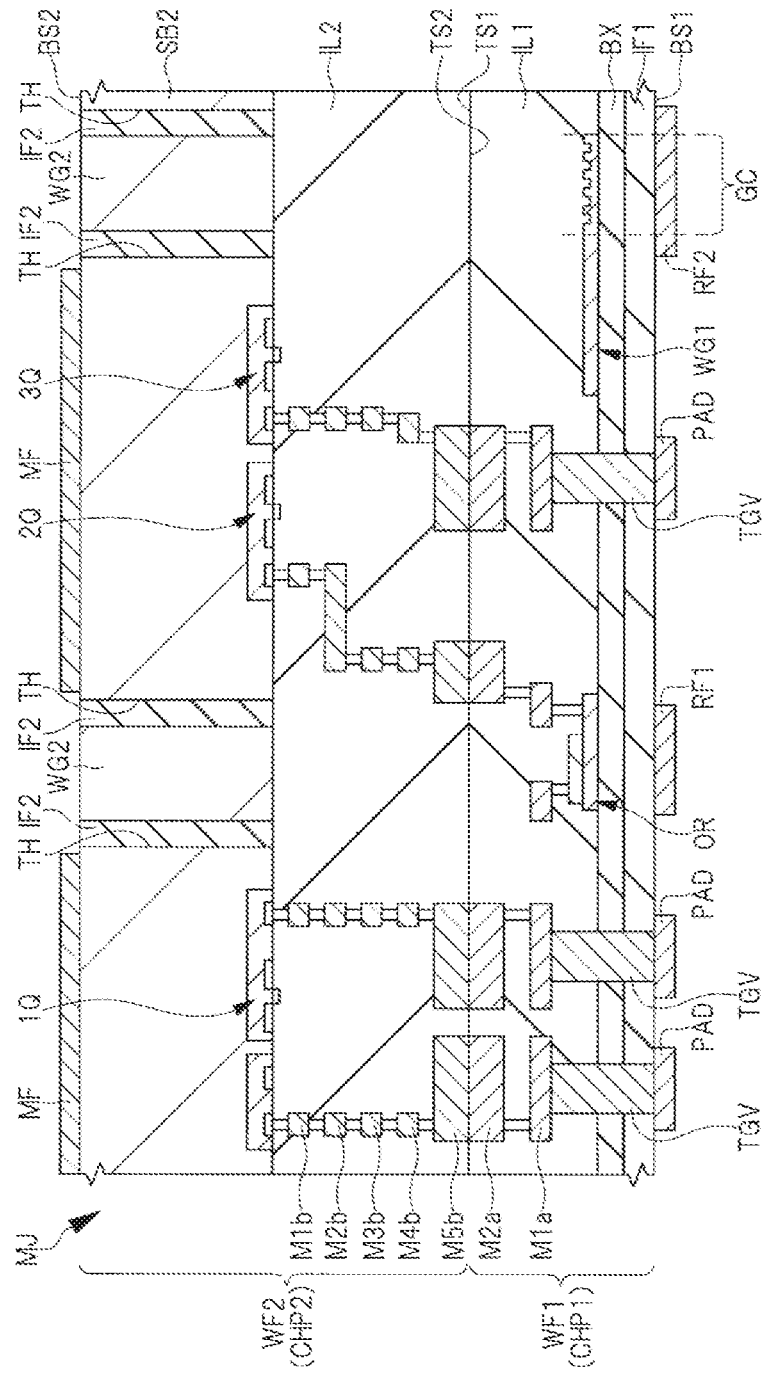
FIG. 11 is a cross-sectional view illustrating a manufacturing step following FIG. 10.

Next, as shown in FIG. 11, a hole is formed by penetrating the insulating film BX and the insulating film IF1 and removing a portion of the interlayer insulating film IL1 so as to reach the wiring M1a from the back surface BS1 of the wafer WF1. Next, a conductive film comprised of copper, for example, is buried in the hole to form the through electrode TGV in the hole. Next, a conductive film including, for example, a copper film or an aluminum film is formed on the lower surface of the insulating film IF1, and the conductive film is patterned to form pad electrode PAD connected to the through electrode TGVs.

By the same step as the step of forming the pad electrode PAD, the reflective film RF1 can be formed under the optical receiver OR, and the reflective film RF2 can be formed under the grating coupler GC. In this case, the manufacturing step can be simplified.

The reflective film RF1 and the reflective film RF2 may be formed of a conductive film different from the pad electrode PAD. Such a conductive film is formed by a process separate from the pad electrode PAD. Although the manufacturing costs for separately forming the reflective film RF1 and the reflective film RF2 are increased, the materials of the reflective film RF1 and the reflective film RF2 are not limited to the materials used for the pad electrode PAD, and can be freely selected so that a desired reflectance can be obtained. Examples of such a conductive film include a metal film such as a titanium nitride film, a tantalum nitride film, or a tungsten film.

After the manufacturing process of FIG. 11, a bump electrode BE comprised of, for example, a solder ball is formed so as to be in contact with the pad electrode PAD. Next, the wafer WF1 and the wafer WF2 laminated to each other are singulated by a dicing step, whereby a plurality of semiconductor chips CHP1 and a plurality of semiconductor chips CHP2 laminated to each other as shown in FIG. 2 are obtained. That is, a plurality of semiconductor modules MJ are formed.

As described above, since the dicing process is performed while the wafer WF1 and the wafer WF2 are laminated with each other, the planar size of the semiconductor chip CHP1 and the planar size of the semiconductor chip CHP2 are the same.

Here, a blade or laser technique is used for the dicing step, and according to the study by the inventors of the present application, it has been found that there is some variation in the size of each chip in these techniques. Further, since the thermal expansion coefficients of the insulating films such as the interlayer insulating film IL1 and the interlayer insulating film IL2 differ from those of the silicon such as the semiconductor substrate SB2, the planar sizes of the semiconductor chip CHP1 and the semiconductor chip CHP2 may change after the dicing step.

In particular, when the wafer WF1 and the wafer WF2 laminated to each other are diced together as in present embodiment, variations in the plane sizes of the semiconductor modules MJ become large in one semiconductor module MJ. Such variations are in the range of 5 μm or less. That is, in the present embodiment semiconductor module MJ, as described with reference to FIG. 1, the positions of the first side S1 to the fourth side S4 of the semiconductor chip CHP1 and the positions of the first side S1 to the fourth side S4 of the semiconductor chip CHP2 are shifted by 5 μm or less, respectively.

Figure 12:
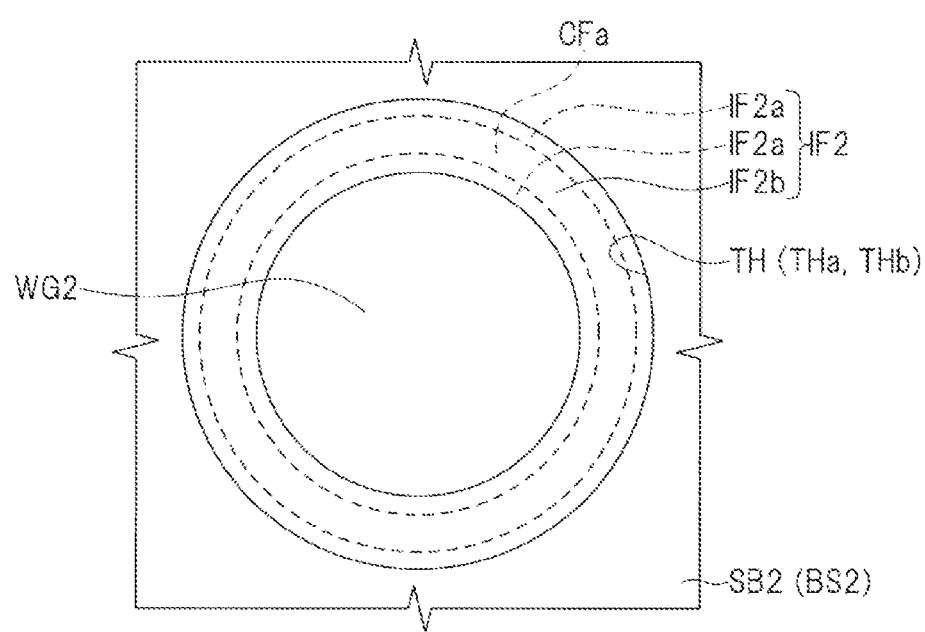
FIG. 12 is a main portion plan view illustrating an optical waveguide of second embodiment.

The semiconductor module MJ of the second embodiment will be described below with reference to FIG. 12. Hereinafter, differences from first embodiment will be mainly described. FIG. 12 is a plan view of the first embodiment corresponding to FIG. 4, and is a main portion plan view of the shape of the optical waveguides WG2 formed on the semiconductor chips CHP2 of the semiconductor modules MJ as viewed from the back surface BS2.

As shown in FIG. 12, in the second embodiment, the semiconductor substrate SB2 surrounded by the through-hole TH is used as the optical waveguide WG2 in the same manner as in the first embodiment, but the structure in the through-hole TH differs from that in the first embodiment. That is, two insulating films IF2a and a semiconductor film CFa sandwiched between the two insulating films IF2a are formed in the first hole THa which is a part of the through hole TH, and an insulating film IF2b is formed in the second hole THb which is a part of the through hole TH.

The method of manufacturing such a second embodiment will be described below with reference to FIGS. 13 to 17.

Figure 13:
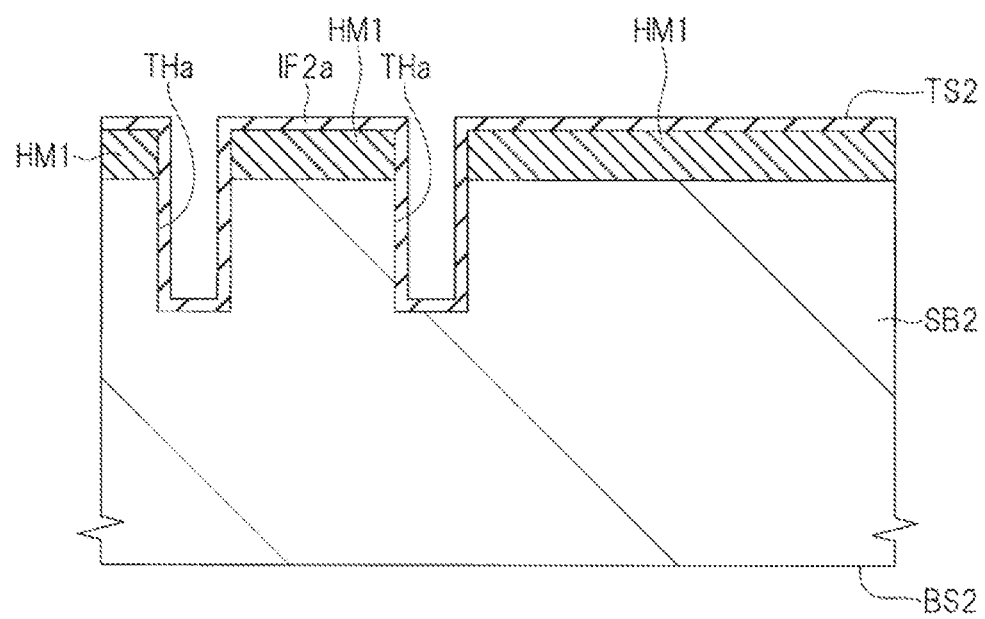
FIG. 13 is a cross-sectional view illustrating a manufacturing step of a semiconductor chip according to second embodiment.

First, as shown in FIG. 13, a hard mask HM1 comprised of an insulating film such as a silicon nitride film is formed on the surface of the semiconductor substrate SB2 by, e.g., CVD. Next, the hard mask HM1 is patterned by a photolithography technique and a dry etch process. Next, dry etching is performed using the hard mask HM1 as a mask to form a first hole THa from the front face of the semiconductor substrate SB2 to the inside of the semiconductor substrate SB2. Next, an insulating film IF2a comprised of, e.g., silicon oxide is formed in the first hole THa and on the semiconductor substrate SB2 by, e.g., CVD. At this stage, the first hole THa is not completely filled with the insulating film IF2a.

Figure 14:
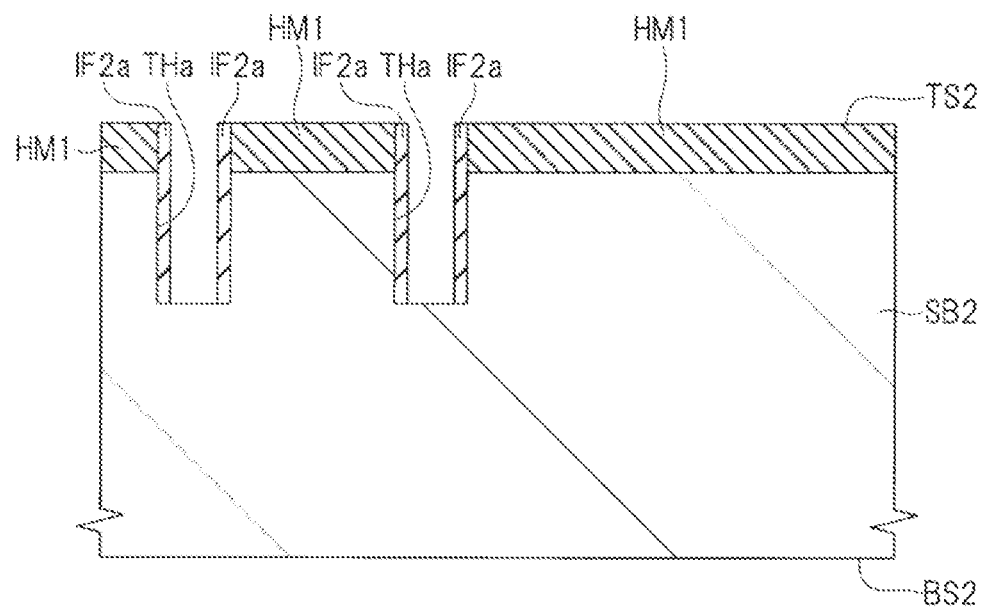
FIG. 14 is a cross-sectional view illustrating a manufacturing step following to FIG. 13.

Next, as shown in FIG. 14, the insulating film IF2a is anisotropically etched to remove the insulating film IF2a formed on the bottom of the first hole THa and the semiconductor substrate SB2. As a result, the insulating film IF2a is left on both side surfaces of the first hole THa.

Figure 15:
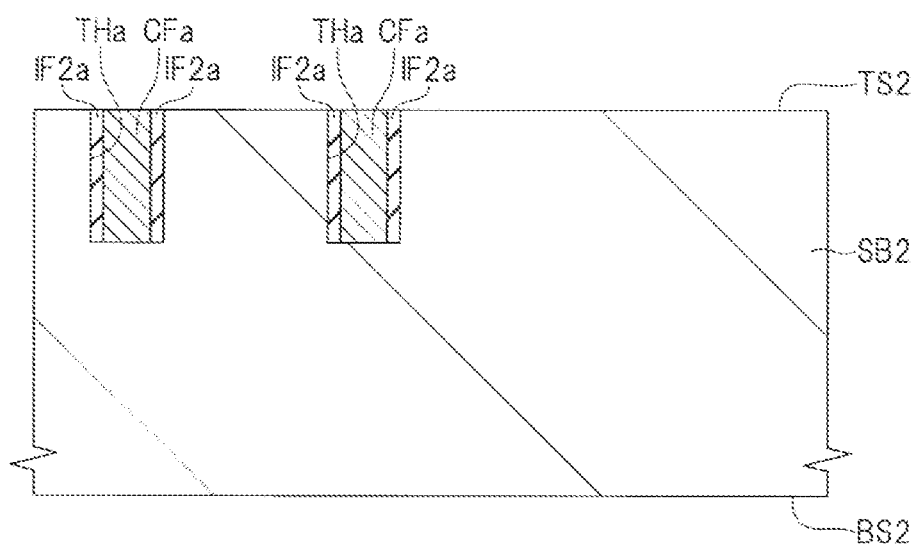
FIG. 15 is a cross-sectional view illustrating a manufacturing step following FIG. 14.

Next, as shown in FIG. 15, a semiconductor film CFa comprised of, for example, silicon is formed on the semiconductor substrate SB2 exposed in the first hole THa by, for example, epitaxial growth. The semiconductor film CFa may be formed so as to fill at least the first hole THa, and may also be formed on the hard mask HM1 outside the first hole THa. Since the hard mask HM1 is formed on the semiconductor substrate SB2 outside the first hole THa, epitaxial growth is selectively performed in the semiconductor substrate SB2 at the bottom of the first hole THa. The semiconductor film CFa may be another semiconductor film such as silicon germanium, for example, or may be a conductive film other than the semiconductor film.

Next, the semiconductor film CFa formed outside the first hole THa is removed by a polishing treatment using CMP method so that the semiconductor film CFa in the first hole THa remains, and then the hard mask HM1 is removed by a wet etching treatment. As a result, the insulating film IF2a is formed on both side surfaces of the first hole THa, and the semiconducting film CFa is formed between the two insulating films IF2a. That is, the first hole THa is filled with the insulating film IF2a and the semiconducting film CFa.

Figure 16:
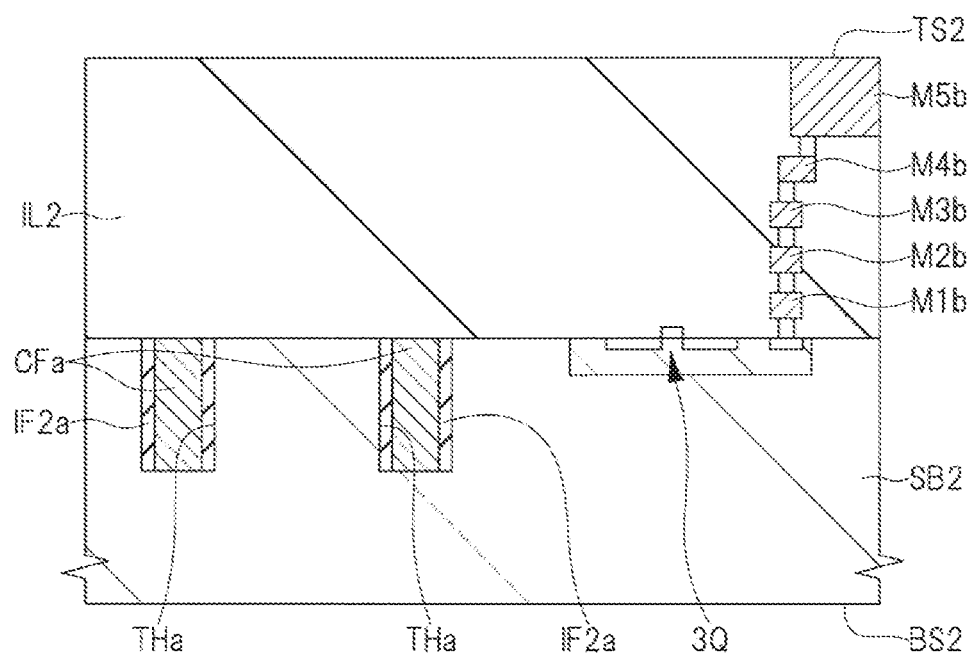
FIG. 16 is a cross-sectional view illustrating a manufacturing step following FIG. 15.

Next, as shown in FIG. 16, semiconductor devices are formed on the surfaces of the semiconductor substrate SBs 2. Here, only a MISFET 3Q is shown as a semiconductor device. Next, as in first embodiment, an interlayer insulating film IL2 and wirings M1b to M5b are formed on the semiconductor substrate SB 2. Thereafter, the back surface of the semiconductor substrate SB2 is polished to reduce the thickness of the semiconductor substrate SB2.

Figure 17:
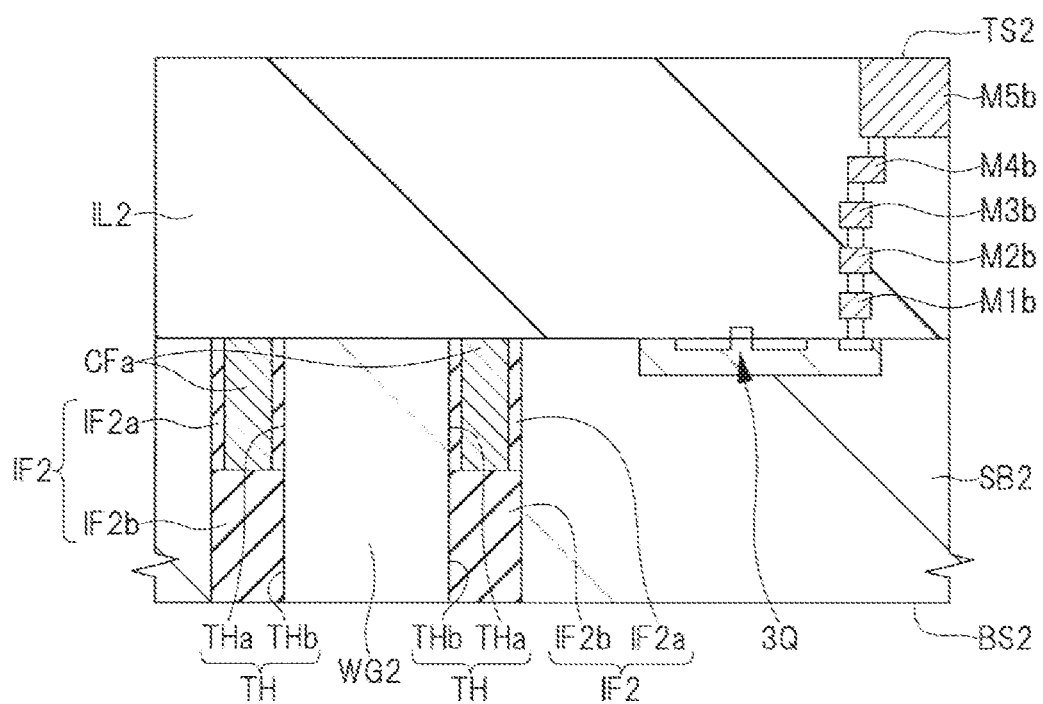
FIG. 17 is a cross-sectional view illustrating a manufacturing step following FIG. 16.

Next, as shown in FIG. 17, a second hole THb is formed in the semiconductor substrate SB2 by photolithography and dry etching so as to reach the first hole THa from the back surface of the semiconductor substrate SB2. As a result, the first hole THa and the second hole THb communicate with each other, and a through hole TH including the first hole THa and the second hole THb is formed.

Next, an insulating film IF2b comprised of, e.g., silicon oxide is formed on the back surface of the semiconductor substrate SB2 by, e.g., CVD so as to fill the second hole THb. Next, the insulating film IF2b formed outside the second hole THb is removed by CMP method polishing step so that the insulating film IF2b in the second hole THb remains. Thereby, the insulating film IF2a and the insulating film IF2b are integrated in the through hole TH, and an insulating film IF2 including the insulating film IF2a and the insulating film IF2b is formed. The semiconductor substrate SB2 surrounded by the through hole TH serves as an optical waveguide WG2.

The inner diameter of the through hole TH, which is the width of the optical waveguide WG2 in the second embodiment, is the same as that of the first embodiment, but in the second embodiment, the difference between the outer diameter and the inner diameter of the through hole TH, which is the width of the through hole TH, is slightly wider than that of the first embodiment, and is, for example, 15 µm to 50 µm.

The widths of the two insulating films IF2a in the first holes THa are, for example, 2 to 5 µm, respectively, and the widths of the semiconducting films CFa in the first holes THa are, for example, 11 to 40 µm. The depth of the through hole TH is, for example, 130 to 340 µm, the depth of the first hole THa is, for example, 65 to 170 µm, and the depth of the second hole THb is, for example, 65 to 170 µm.

When it is desired to increase the depth of the through hole TH, it is effective to increase the width of the through hole TH in order to maintain the aspect ratio in the etching treatment. For example, it is assumed that the depth of the first hole THa is increased in order to increase the depth of the through hole TH. At this time, since the inside of the first hole THa cannot be completely filled only by the insulating film IF2a in some cases, the inside of the first hole THa can be completely filled with the insulating film IF2a and the semiconductor film CFa by filling the portion which has not been completely filled with the semiconductor film CFa.

The thickness of the insulating film IF2a is a thickness capable of functioning as a cladding layer. In second embodiment, the thickness of the insulating film IF2a functioning as the cladding layer is secured, and the inside of the first hole THa can be completely filled with the insulating film IF2a and the semiconductor film CFa, so that the cladding characteristics can be further stabilized.

As described in the first embodiment, holes may be formed in the through holes TH. However, since there is a possibility that water or the like may enter into the hole, when it is not desired to provide the hole in order to prevent such a possibility, it is useful to fill the first hole THa not only with the insulating film IF2a but also with the semiconductor film CFa, as in the case of second embodiment.

Also in second embodiment, similarly to first embodiment, it is most preferable that the formation position of the first hole THa coincides with the formation position of the second hole THb, but the formation position of the first hole THa and the formation position of the second hole THb may be shifted. In such cases, the insulating film IF2a and the insulating film IF2b may be separated from each other, and the semiconductor film CFa and the semiconductor substrate SB2 may be contacted with each other at the divided portion. As a result, the light propagating in the optical waveguide WG2 leaks slightly at the cut-off point. If the amount of light leaking is small, there is no significant influence on the propagation of light, but if the amount of light leaking is large, it leads to light loss. Therefore, even if the formation position of the first hole THa and the formation position of the second hole THb are deviated from each other, it is most preferable that the insulating film IF2a contacts the insulating film IF2b and is integrated with the insulating film IF2b.

Figure 18:
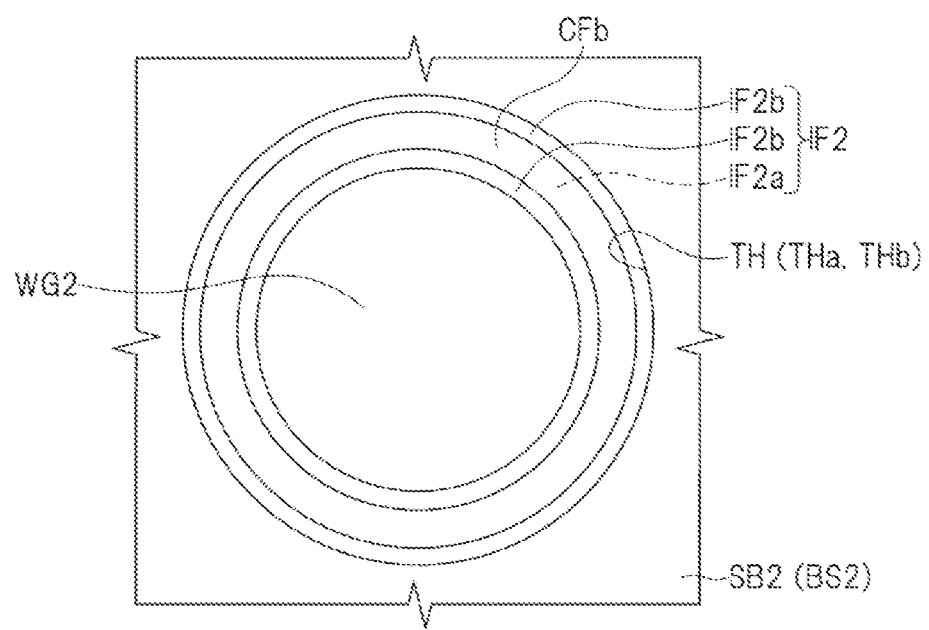
FIG. 18 is a main portion plan view illustrating an optical waveguide of a third embodiment.

The semiconductor module MJ of the third embodiment will be described below with reference to FIG. 18. Hereinafter, differences from first embodiment will be mainly described. FIG. 18 is a plan view of the first embodiment corresponding to FIG. 4, and is a main portion plan view of the shape of the optical waveguides WG2 formed on the semiconductor chips CHP2 of the semiconductor modules MJ as viewed from the back surface BS2.

As shown in FIG. 18, in the third embodiment, the semiconductor substrate SB2 surrounded by the through hole TH is used as the optical waveguide WG2 similarly to the first embodiment, but the structure in the through hole TH differs from that of the first embodiment. That is, an insulating film IF2a is formed in the first hole THa which is a part of the through hole TH, and two insulating films IF2b and a conductive film CFb sandwiched between the two insulating films IF2b are formed in the second hole THb which is a part of the through hole TH.

Figure 19:
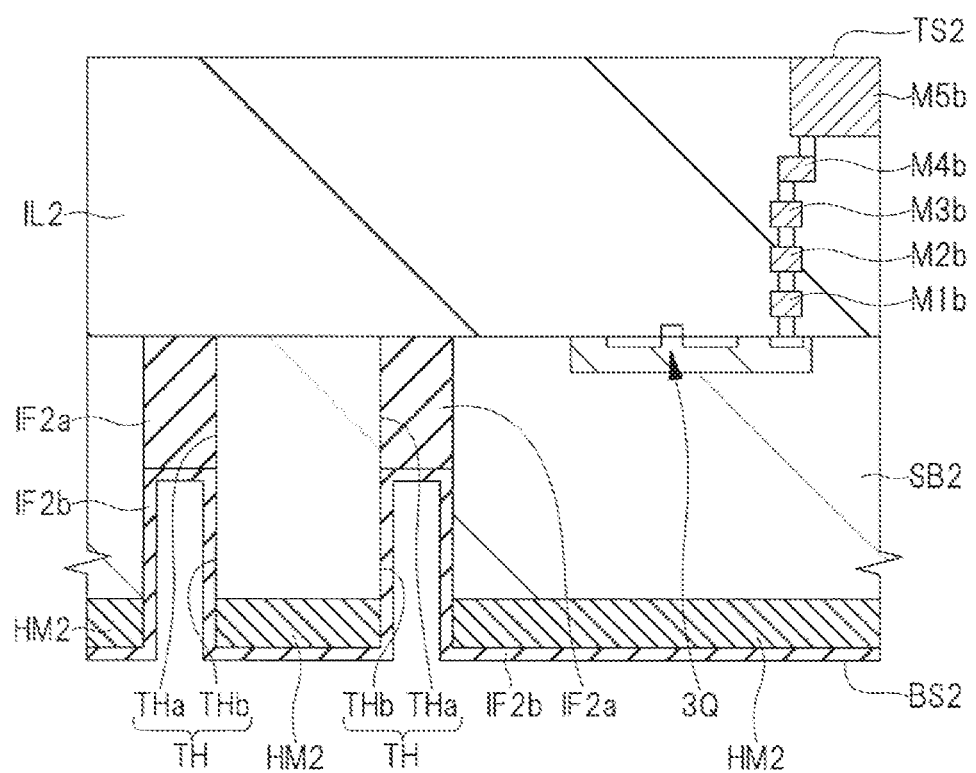
FIG. 19 is a cross-sectional view illustrating a manufacturing step of a semiconductor chip according to third embodiment.

The manufacturing method of such a third embodiment will be described below with reference to FIGS. 19 to 21. The manufacturing method of third embodiment is the same as that of first embodiment up to the manufacturing step of FIG. 6. FIG. 19 shows the manufacturing step following to FIG. 6.

First, as shown in FIG. 19, a hard mask HM2 comprised of an insulating film such as a silicon nitride film is formed on the back surface of the semiconductor substrate SB2 by, e.g., CVD. Next, the hard mask HM2 is patterned by a photolithography technique and a dry etch treatment. Next, dry etching is performed using the hard mask HM2 as a mask so as to reach the first hole THa from the back surface of the semiconductor substrate SB2, thereby forming the second hole THb in the semiconductor substrate SB 2. Next, an insulating film IF2b comprised of, e.g., silicon oxide is formed in the second hole THb and on the lower surface of the hard mask HM2 by, e.g., CVD. At this stage, the second hole THb is not completely filled with the insulating film IF2b.

Figure 20:
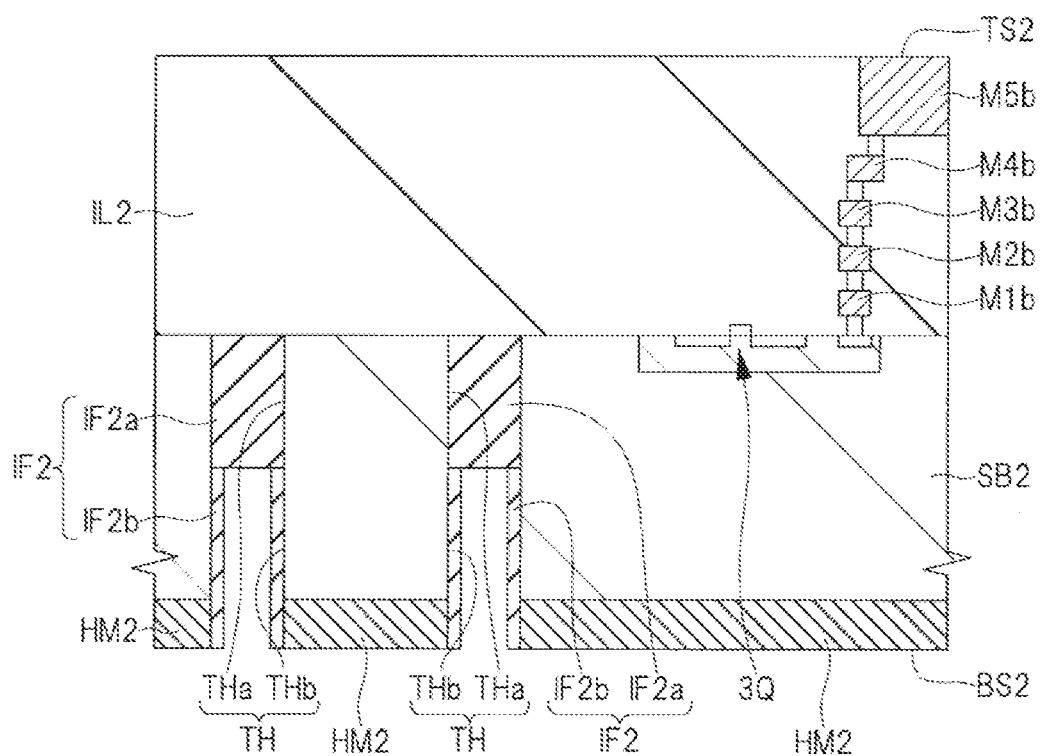
FIG. 20 is a cross-sectional view illustrating a manufacturing step following FIG. 19.

Next, as shown in FIG. 20, the insulating film IF2b is anisotropically etched to remove the insulating film IF2b formed on the bottom of the second hole THb and the lower surface of the hard mask HM2. As a result, the insulating film IF2b is left on the side surface of the second hole THb.

Figure 21:
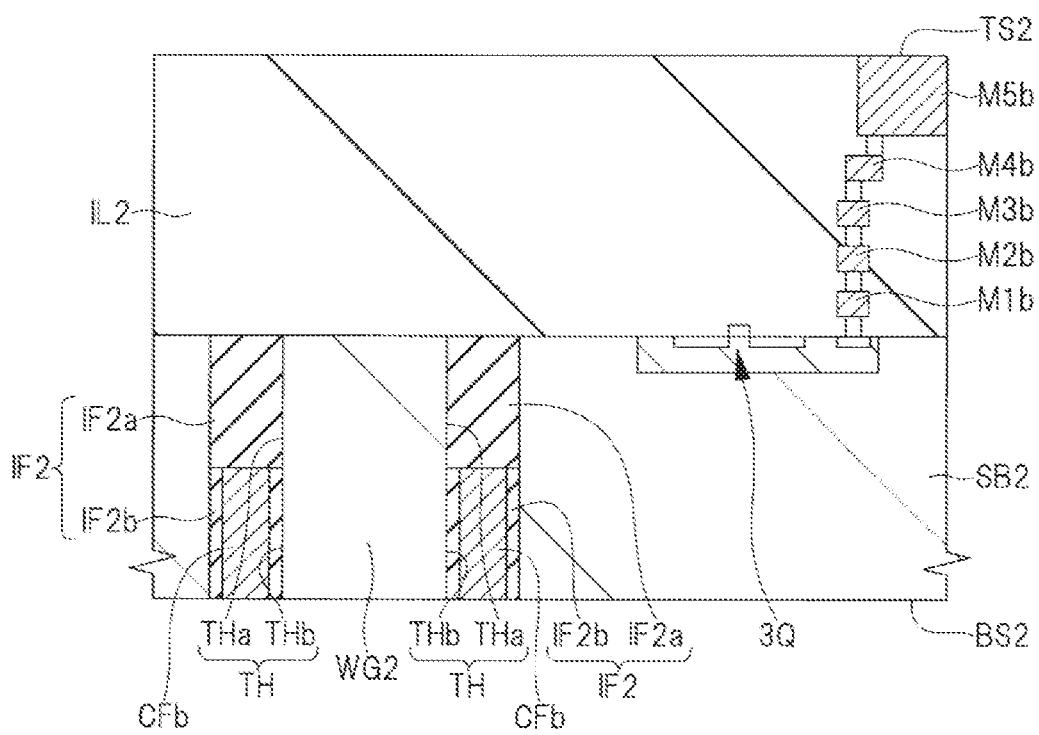
FIG. 21 is a cross-sectional view illustrating a manufacturing step following FIG. 20.

Next, as shown in FIG. 21, a seed film comprised of copper, for example, is formed in the second hole THb and on the lower surface of the hard mask HM2 by a sputtering method, and thereafter, a conductive film CFb comprised of copper, for example, is formed on the seed film by a plating method, for example. The seed film is taken into the conductive film CFb and integrated with the conductive film CFb. The conductive film CFb is formed so as to fill at least the second hole THb. Since the hard mask HM2 is formed on the back surface of the semiconductor substrate SB2, the conductive film CFb is not in direct contact with the semiconductor substrate SB2. For this reason, it is possible to prevent metal such as copper from being incorporated into the semiconductor substrate SB2 and causing problems such as metal contamination.

Before forming the seed film comprised of copper, a barrier metal film comprised of tantalum nitride, for example, may be formed, and this barrier metal film may be a part of the conductive film CFb. The conductive film CFb may be a polycrystalline silicon film formed by, for example, a CVD method.

Next, the conductive film CFb formed outside the second hole THb is removed by a polishing process using a CMP method so that the conductive film CFb in the second hole THb remains, and then the hard mask HM2 is removed by a wet etching treatment. Thereby, the insulating film IF2b is formed on both side surfaces of the second hole THb, and the conductive film CFb is formed between the two insulating films IF2b. That is, the second hole THb is filled with the insulating film IF2b and the conductive film CFb. Thereby, the insulating film IF2a and the insulating film IF2b are integrated in the through hole TH, and an insulating film IF2 including the insulating film IF2a and the insulating film IF2b is formed. The semiconductor substrate SB2 surrounded by the through hole TH serves as an optical waveguide WG2.

The inner diameter of the through hole TH, which is the width of the optical waveguide WG2 in the third embodiment, is the same as that of the first embodiment, but in the third embodiment, the difference between the outer diameter and the inner diameter of the through hole TH, which is the width of the through hole TH, is slightly wider than that of the first embodiment, and is, for example, 15 μm to 50 μm. The widths of the two insulating films IF2b in the second holes THb are, for example, 2 to 5 μm, respectively, and the widths of the conductive films CFb in the second holes THb are, for example, 11 to 40 μm.

In third embodiment, when it is desired to increase the depth of the through hole TH, the depth of the second hole THb is increased. At this time, since the inside of the second hole THb may not be completely buried only by the insulating film IF2b, by filling the portion which has not been buried with the conductive film CFb, the inside of the second hole THb can be completely buried with the insulating film IF2b and the conductive film CFb.

A thickness of the insulating film IF2b is a thickness capable of functioning as a cladding layer. In third embodiment, the thickness of the insulating film IF2b functioning as the cladding layer is secured, and the second hole THb can be completely filled with the insulating film IF2b and the conductive film CFb, so that the cladding characteristics can be further stabilized.

Like second embodiment, third embodiment technique is also useful when it is not desired to provide a hole in the through hole TH.

Further, in third embodiment, similarly to first embodiment and second embodiment, it is most preferable that the formation position of the first hole THa coincides with the formation position of the second hole THb, but the formation position of the first hole THa and the formation position of the second hole THb may be shifted. In such cases, the insulating film IF2a and the insulating film IF2b may be divided, but for the same reason as in second embodiment, it is most preferable that the insulating film IF2b contacts the insulating film IF2a and is integrated with the insulating film IF2a.

The semiconductor module MJ of fourth embodiment will be described below with reference to FIG. 22. Hereinafter, differences from second embodiment and third embodiment will be mainly described.

Figure 22:
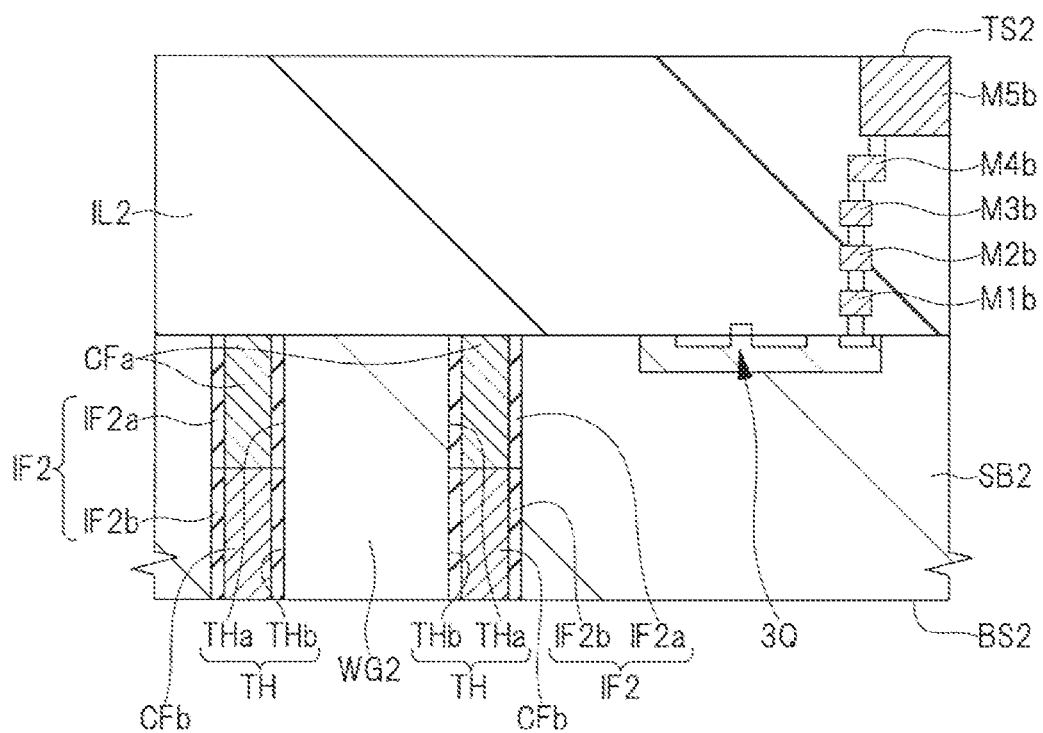
FIG. 22 is a cross-sectional view illustrating a manufacturing step for a semiconductor chip according to fourth embodiment.

As shown in FIG. 22, in fourth embodiment, the structure in the first hole THa is formed using the technique described in second embodiment, and the structure in the second hole THb is formed using the technique described in third embodiment. That is, the first hole THa is filled with the insulating film IF2a and the semiconducting film CFa, and the second hole THb is filled with the insulating film IF2b and the conductive film CFb.

Thus, fourth embodiment can further improve the cladding properties compared to second embodiment and third embodiment.

Although the invention made by the inventors of the present application has been specifically described based on the embodiments, the present invention is not limited to the above-described embodiments, and various modifications can be made without departing from the gist thereof.

For example, in the semiconductor chip CHP1 and the semiconductor chip CHP2, a wiring lower than the uppermost layer wiring, such as the wiring Mia and the wiring M1b, may be a wiring formed by stacking a titanium nitride film, an aluminium film, and a titanium nitride film and patterning the stacked film, instead of a wiring having a damascene structure. After forming the wiring and forming the interlayer insulating film so as to cover the wiring, the interlayer insulating film is planarized by polishing the upper surface of the interlayer insulating film by the CMP method.

In the semiconductor chip CHP1, the two-layer wiring of wiring Mia and wiring M2a is exemplified as the multi-layer wiring, but the multi-layer wiring of the semiconductor chip CHP1 may be three or more layers. In the semiconductor chip CHP2, the five-layer wiring of wiring M1b to wiring M5b is exemplified as the multilayer wiring, but the multi-layer wiring of the semiconductor chip CHP2 may be smaller than five layers or larger than five layers.

What is claimed is:

1. A semiconductor module comprising:
    a first semiconductor chip comprising:
        an optical device; and
        a first wiring formed over the optical device and electrically connected with the optical device; and
    a second semiconductor chip comprising:
        a substrate;
        a semiconductor element formed on a top surface side of the substrate and forming a part of an electric circuit; and
        a second wiring formed over the semiconductor element and electrically connected with the semiconductor element,
    wherein the second semiconductor chip is mounted on the first semiconductor chip,
    wherein a top surface of the first semiconductor chip is laminated with a top surface of the second semiconductor chip such that the first wiring and the second wiring are in direct contact with each other,
    wherein a through hole having a circular shape in plan view is formed in the substrate;
    wherein a first cladding layer is formed in the through hole, and
    wherein the first cladding layer is comprised of a material having a refractive index smaller than that of the material constituting the substrate surrounded by the through hole.

2. The semiconductor module according to claim 1, wherein the optical device overlaps the substrate surrounded by the through holes in plan view.

3. The semiconductor module according to claim 2,
    wherein the substrate surrounded by the through hole functions as an optical waveguide,
    wherein the optical device is an optical receiver or a grating coupler, and
    wherein light is transmitted or received between an optical communication device outside the semiconductor module and the optical device via the optical waveguide.

4. The semiconductor module according to claim 3, wherein a reflective film capable of reflecting the light is formed in the first semiconductor chip below the optical device and at a position overlapping the optical device in plan view.

5. The semiconductor module according to claim 1, wherein a metallic film is formed on a back surface of the substrate in region other than the substrate surrounded by the through hole.

6. The semiconductor module according to claim 1, wherein the first cladding layer is formed of an insulating film.

7. The semiconductor module according to claim 1,
    wherein the through hole has a first portion and a second portion closer to a back surface of the substrate than the first portion,
    wherein the first cladding layer formed at the first portion is formed of a first insulating film, and
    wherein the first cladding layer formed at the second portion is formed of a second insulating film, a third insulating film, and a first conductive film sandwiched between the second insulating film and the third insulating film.

8. The semiconductor module according to claim 1,
    wherein the through hole has a first portion and a second portion closer to a back surface of the substrate than the first portion,
    wherein the first cladding layer formed in the first portion is formed of a first insulating film, a second insulating film, and a first conductive film sandwiched between the first insulating film and the second insulating film, and
    wherein the first cladding layer formed in the second portion is formed of a third insulating film.

9. The semiconductor module according to claim 1,
    wherein the through hole has a first portion and a second portion closer to a back surface of the substrate than the first portion,
    wherein the first cladding layer formed in the first portion is formed of a first insulating film, a second insulating film, and a first conductive film sandwiched between the first insulating film and the second insulating film, and
    wherein the first cladding layer formed in the second portion is formed of a third insulating film, a fourth insulating film, and a second conductive film sandwiched between the third insulating film and the fourth insulating film.

10. The semiconductor module according to claim 1, wherein, in plan view, an outer periphery of the first semiconductor chip coincides with an outer periphery of the second semiconductor chip within a range of 5 μm.

11. The semiconductor module according to claim 1,
    wherein, in plan view, the first semiconductor chip and the second semiconductor chip each have a first side and a second side along a first direction and a third side and a fourth side along a second direction intersecting the first direction,
    wherein the first side of the first semiconductor chip and the first side of the second semiconductor chip coincide within a range of 5 μm,
    wherein the second side of the first semiconductor chip and the second side of the second semiconductor chip coincide within a range of 5 μm,
    wherein the third side of the first semiconductor chip and the third side of the second semiconductor chip coincide within a range of 5 μm, and
    wherein the fourth side of the first semiconductor chip and the fourth side of the second semiconductor chip coincide within a range of 5 μm.

12. The semiconductor module according to claim 3,
    wherein the first semiconductor chip comprises:
        a first multilayer wiring formed on the optical device and comprising:
            the first wiring;
        a first insulating film formed below the optical device and formed on a back surface side of the first semiconductor chip;
        a pad electrode formed on a lower surface of the first insulating film;
        a through electrode penetrating the first insulating film and connected to the pad electrode and the first wiring; and
        an external connection terminal formed on a lower surface of the pad electrode, and wherein the second semiconductor chip further comprises:
a second multilayer wiring formed over the semiconductor element and including the second wiring.

13. A method of communication using the semiconductor module according to claim 12, the method comprising:
receiving a first electrical signal from an electrical device external to the semiconductor module in the first semiconductor chip via the external connection terminal and the through electrode;
transmitting the first electrical signal received by the first semiconductor chip from the first semiconductor chip to the second semiconductor chip;
processing the first electrical signal received by the second semiconductor chip into a second electrical signal using the semiconductor element;
transmitting the second electrical signal from the second semiconductor chip to the first semiconductor chip;
converting the second electrical signal received by the first semiconductor chip into an optical signal using the optical device; and
transmitting the optical signal from the first semiconductor chip to the optical communication device external to the semiconductor module via the optical waveguide.

14. A method of communication using the semiconductor module according to claim 12, the method comprising:
receiving an optical signal from the optical communication device external to the semiconductor module in the first semiconductor chip via the optical waveguide;
converting the optical signal received by the first semiconductor chip into a third electrical signal using the optical device;
transmitting the third electrical signal from the first semiconductor chip to the second semiconductor chip;
processing the third electrical signal received by the second semiconductor chip into a fourth electrical signal using the semiconductor element; and
transmitting the fourth electrical signal to an electrical device external to the semiconductor module via the external connection terminal and the through electrode.

15. A method of manufacturing a semiconductor module, the method comprising:
(a) providing a first wafer having a region to be a first semiconductor chip, the first semiconductor chip comprising:
a first substrate;
an optical device formed over the first substrate; and
a first wiring electrically connected with the optical device;
(b) providing a second wafer having a region to be a second semiconductor chip, the second semiconductor chip comprising:
a second substrate;
a semiconductor element formed on top surface side of the second substrate and constituting a part of an electric circuit,
a second wiring formed over the semiconductor element and electrically connected with the semiconductor element;
a through hole formed in the second substrate and having circular shape in plan view; and
a first cladding layer formed in the through hole;
(c) laminating, after providing the first wafer and providing the second wafer, a top surface of the first wafer and a top surface of the second wafer so that the first wiring and the second wiring are in direct contact with each other;
(d) removing, after laminating, the first substrate; and
(e) forming, after removing the first substrate, a plurality of semiconductor modules having the first semiconductor chip and the second semiconductor chip laminated to each other by singulating the first wafer and the second wafer laminated to each other.

16. The method according to claim 15,
wherein providing the second wafer comprises:
(b1) forming a first hole in the second substrate to reach an inside of the second substrate from a top surface of the second substrate;
(b2) forming a first insulating film in the first hole;
(b3) forming, after forming the first insulating film, a second hole in the second substrate so as to reach the first hole from a back surface of the second substrate; and
(b4) forming a second insulating film in the second hole,
wherein the first hole and the second hole constitute a through hole, and
wherein the first insulating film and the second insulating film constitute the first cladding layer.

17. The method according to claim 15,
wherein providing the second wafer comprises:
(b1) forming a first hole in the second substrate so as to reach an inside of the second substrate from the top surface of the second substrate;
(b2) forming a first insulating film on both sides of the first hole;
(b3) forming a semiconductor film in the first hole via the first insulating film;
(b4) forming, after forming the semiconductor film, a second hole in the second substrate so as to reach the first hole from a back surface of the second substrate; and
(b5) forming a second insulating film in the second hole,
wherein the first hole and the second hole constitute a through hole, and
wherein the first insulating film, the semiconductor film and the second insulating film constitute the first cladding layer.

18. The method according to claim 15,
wherein providing the second wafer comprises:
(b1) forming a first hole in the second substrate so as to reach an inside of the second substrate from the top surface of the second substrate;
(b2) forming a first insulating film in the first hole;
(b3) forming, after forming the first insulating film, a second hole in the second substrate so as to reach the first hole from a back surface of the second substrate;
(b4) forming a second insulating film on both sides of the second hole; and
(b5) forming a conductive film in the second hole via the second insulating film,
wherein the first hole and the second hole constitute the through hole, and
wherein the first insulating film, the second insulating film, and the conductive film constitute the first cladding layer.

19. The method according to claim 15,
wherein providing the second wafer comprises:
(b1) forming a first hole in the second substrate so as to reach an inside of the second substrate from the top surface of the second substrate;
(b2) forming a first insulating film on both sides of the first hole;

(b3) forming a semiconductor film in the first hole via the first insulating film;

(b4) forming, after forming the semiconductor film, a second hole in the second substrate so as to reach the first hole from a back surface of the second substrate;

(b5) forming a second insulating film on both sides of the second hole; and (b6) forming a conductive film in the second hole via the second insulating film, wherein the first hole and the second hole constitute a through hole, and wherein the first insulating film, the semiconductor film, the second insulating film, and the conductive film constitute the first cladding layer.

20. The method according to claim 15, wherein, in laminating, the optical device is formed so as to overlap the second substrate surrounded by the through hole in plan view.

* * * * *